US008441007B2

(12) United States Patent
Arai

(10) Patent No.: US 8,441,007 B2
(45) Date of Patent: May 14, 2013

(54) DISPLAY DEVICE AND MANUFACTURING METHOD THEREOF

(75) Inventor: Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 649 days.

(21) Appl. No.: 12/634,060

(22) Filed: Dec. 9, 2009

(65) Prior Publication Data

US 2010/0163865 A1   Jul. 1, 2010

(30) Foreign Application Priority Data

Dec. 25, 2008   (JP) .................................. 2008-330094

(51) Int. Cl.
*H01L 29/786* (2006.01)

(52) U.S. Cl.
USPC ......... 257/43; 257/59; 257/E29.296; 438/104

(58) Field of Classification Search ............. 257/43, 257/59, E29.296, E33.019, E21.459, E21.414; 438/104, 46, 158

See application file for complete search history.

(56) References Cited

U.S. PATENT DOCUMENTS

| 5,162,901 | A | * | 11/1992 | Shimada et al. ............. 349/39 |
| 5,731,856 | A |   | 3/1998 | Kim et al. |
| 5,744,864 | A |   | 4/1998 | Cillessen et al. |
| 5,847,410 | A |   | 12/1998 | Nakajima |
| 6,160,272 | A | * | 12/2000 | Arai et al. .................... 257/72 |
| 6,294,274 | B1 |   | 9/2001 | Kawazoe et al. |
| 6,563,174 | B2 |   | 5/2003 | Kawasaki et al. |
| 6,586,346 | B1 |   | 7/2003 | Yamazaki et al. |
| 6,727,522 | B1 |   | 4/2004 | Kawasaki et al. |
| 6,960,812 | B2 |   | 11/2005 | Yamazaki et al. |
| 7,046,220 | B2 |   | 5/2006 | Tagawa et al. |

(Continued)

FOREIGN PATENT DOCUMENTS

| EP | 1737044 A | 12/2006 |
| EP | 2226847 A | 9/2010 |

(Continued)

OTHER PUBLICATIONS

M. W. Prins, K. O. Grosse-Holz, G. Muller, J. F. M. Cillessen, J. B. Giesbers, R. P. Weening, and R. M. Wolf, "A ferroelectric transparent thin-film transistor," Appl. Phys. Lett., Jun. 17, 1996, vol. 68, 3650-3652.

(Continued)

*Primary Examiner* — Roy Potter
(74) *Attorney, Agent, or Firm* — Eric J. Robinson; Robinson Intellectual Property Law Office, P.C.

(57) ABSTRACT

A display device includes a first wiring functioning as a gate electrode formed over a substrate, a gate insulating film formed over the first wiring, a second wiring and an electrode layer provided over the gate insulating film, and a high-resistance oxide semiconductor layer formed between the second wiring and the electrode layer are included. In the structure, the second wiring is formed using a stack of a low-resistance oxide semiconductor layer and a conductive layer over the low-resistance oxide semiconductor layer, and the electrode layer is formed using a stack of the low-resistance oxide semiconductor layer and the conductive layer which is stacked so that a region functioning as a pixel electrode of the low-resistance oxide semiconductor layer is exposed.

12 Claims, 24 Drawing Sheets

U.S. PATENT DOCUMENTS

| | | | |
|---|---|---|---|
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,301,211 | B2 | 11/2007 | Yamazaki et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,582,904 | B2 | 9/2009 | Fujii et al. |
| 7,674,650 | B2 | 3/2010 | Akimoto et al. |
| 7,732,819 | B2 | 6/2010 | Akimoto et al. |
| 7,767,505 | B2 | 8/2010 | Son et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1* | 10/2006 | Thelss et al. ............ 445/24 |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0051952 | A1 | 3/2007 | Yamazaki et al. |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0215945 | A1 | 9/2007 | Tokunaga et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0203387 | A1 | 8/2008 | Kang et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1* | 10/2008 | Kim et al. ............ 257/43 |
| 2008/0296568 | A1 | 12/2008 | Ryu et al. |
| 2008/0308796 | A1 | 12/2008 | Akimoto et al. |
| 2008/0308797 | A1 | 12/2008 | Akimoto et al. |
| 2008/0308804 | A1 | 12/2008 | Akimoto et al. |
| 2008/0308805 | A1 | 12/2008 | Akimoto et al. |
| 2008/0308806 | A1 | 12/2008 | Akimoto et al. |
| 2009/0008639 | A1 | 1/2009 | Akimoto et al. |
| 2009/0065771 | A1 | 3/2009 | Iwasaki et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0239335 | A1 | 9/2009 | Akimoto et al. |
| 2009/0278122 | A1 | 11/2009 | Hosono et al. |
| 2009/0280600 | A1 | 11/2009 | Hosono et al. |
| 2010/0025678 | A1 | 2/2010 | Yamazaki et al. |
| 2010/0025679 | A1 | 2/2010 | Yamazaki et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 11-505377 T | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-150107 | 5/2003 |
| JP | 2004-103957 | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-250983 A | 9/2007 |
| JP | 2008-176262 | 7/2008 |
| WO | WO-97/06554 A | 2/1997 |
| WO | WO-2004/114391 | 12/2004 |
| WO | WO-2007/119386 A | 10/2007 |

OTHER PUBLICATIONS

M. Nakamura, N. Kimizuka, and T. Mohri, "The Phase Relations in the $In_2O_3$-$Ga_2ZnO_4$-ZnO System at 1350° C.," Journal of Solid State Chemistry, 1991, vol. 93, p. 298-315.

N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System," Journal of Solid State Chemistry, 1995, vol. 116, p. 170-178.

K. Nomura, H. Ohta, A. Takagi, T. Kamiya, M. Hirano, and H. Hosono, "Room-temperature fabrication of transparent flexible thin-film transistors using amorphous oxide semiconductors," Nature, Nov. 2004, vol. 432 p. 488-492.

K. Nomura, H. Ohta, K. Ueda, T. Kamiya, M. Hirano, and H. Hosono, "Thin-film transistor fabricated in single-crystalline transparent oxide semiconductor," Science, 2003, vol. 300, p. 1269-1272.

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Nakamura.M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Nomura.K et al., "Thin-Film Transistor Fabricated in Single-Crystalline Transparent Oxide Semiconductor,", Science, May 23, 2003, vol. 300, No. 5623, pp. 1269-1272.

Osada.T et al., "15.2: Development of Driver-Integrated Panel using Amorphous In-Ga-Oxide TFT,", SID Digest '09 : SID International Symposium Digest of Technical Papers, May 31, 2009, pp. 184-187.

Li.C et al., "Modulated Structures of Homologous Compounds InMO$_3$(ZnO)$_m$ (M=In,Ga; m=Integer) Described by Four-Dimensional Superspace Group,", Journal of Solid State Chemistry, 1998, vol. 139, pp. 347-355.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, pp. 899-902.

Kanno.H et al., "White Stacked Electrophosphorecent Organic Light-Emitting Device Employing MoO$_3$ as a Change-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous IN-GA-ZN-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by PEALD Grown ZnO TFT,", IMID '07 Digest, 2007, p. 1249-1252.

Godo.H et al., "Temperature Dependence of Characteristics and Electronic Structure for Amorphous IN-GA-ZN-Oxide TFT,", AM-FPD '09 Digest of Technical Papers, Jul. 1, 2009, pp. 41-44.

Osada.T et al., "Development of Driver-Integrated Panel Using Amorphous IN-GA-ZN-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous IN-GA-ZN-Oxide TFT,", SID Digest '09 : SID International Symposium Digest of Technical Papers, May 31, 2009, pp. 1110-1112.

Ohara.H et al., "21.3:4.0 In. QVGA AMOLED Display Using IN-GA-ZN-Oxide TFTS With a Novel Passivation Layer,", SID Digest '09 : SID International Symposium Digest of Technical Papers, May 31, 2009, pp. 284-287.

Miyasaka.M, "58.2 Invited Paper : SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe$_2$O$_4$, and Yb$_2$Fe$_3$O$_7$ Types of Structures for Compounds in the In$_2$O$_3$ and Sc$_2$O$_3$-A$_2$O$_3$-BO Systems [A: Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Na. J et al., "High field-effect mobility amorphous InGaZnO transistors with aluminum electrodes,", Appl. Phys. Lett. (Applied Physics Letters), 2008, vol. 93, No. 6, pp. 063501-1-063501-3.

Bougrine. A et al., "Effect of tin incorporation on physicochemical properties of ZnO films prepared by spray pyrolysis,", Materials Chemistry and Physics, 2005, vol. 91, pp. 247-252.

Nakamura. M et al., "Syntheses and crystal structures of new homologous compounds, indium iron zinc oxides (InFeO3(ZnO)m) (m: natural number) and related compounds,", Kotai Butsuri (Solid State Physics), 1993, vol. 28, No. 5, pp. 317-327.

\* cited by examiner

DISPLAY DEVICE AND MANUFACTURING METHOD THEREOF

BACKGROUND OF THE INVENTION

1. Field of the Invention

The present invention relates to a display device and a manufacturing method thereof. In addition, the present invention relates to an electronic apparatus provided with the display device.

2. Description of the Related Art

There are many kinds of metal oxide and there are various applications of metal oxide. Indium oxide, which is a well-known material, is used as a material for a transparent electrode which is needed for a liquid crystal display or the like.

Some metal oxides have semiconductor characteristics. Metal oxide having semiconductor characteristics is a kind of a compound semiconductor. The compound semiconductor is a semiconductor formed using two or more kinds of elements bonded together. In general, metal oxides become insulators. However, it is known that metal oxides become semiconductors depending on the combination of elements included in the metal oxides.

It is known that some kinds of metal oxide, for example, tungsten oxide, tin oxide, indium oxide, and zinc oxide have semiconductor characteristics. A thin film transistor whose channel formation region is a transparent semiconductor layer formed from such metal oxide is disclosed (see Patent Documents 1, 2, 3, and 4 and Non-Patent Document 1).

Multi-component oxide is known as one of metal oxide having semiconductor characteristics in addition to the above single-component oxide. For example, $InGaO_3(ZnO)_m$ (m: a natural number) including a homologous series is a known material (Non-Patent Documents 2, 3, and 4).

Further, it has been demonstrated that such a homologous thin film described above can be used as a channel layer of a thin film transistor (see Patent Document 5 and Non-Patent Documents 5 and 6).

In addition, Patent Documents 6 and 7 disclose techniques by which a thin film transistor is manufactured using zinc oxide or an In—Ga—Zn—O-based oxide semiconductor as a thin film transistor using a metal oxide semiconductor, and is used as a switching element or the like of an image display device.

REFERENCES

Patent Documents

[Patent Document 1] Japanese Published Patent Application No. S60-198861
[Patent Document 2] Japanese translation of PCT international application No. H11-505377
[Patent Document 3] Japanese Published Patent Application No. H8-264794
[Patent Document 4] Japanese Published Patent Application No. 2000-150900
[Patent Document 5] Japanese Published Patent Application No. 2004-103957
[Patent Document 6] Japanese Published Patent Application No. 2007-123861
[Patent Document 7] Japanese Published Patent Application No. 2007-96055

Non-Patent Documents

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.,* 17 Jun. 1996, Vol. 68 pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.,* 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.,* 1995, Vol. 116, pp. 170-178
[Non-Patent Document 4] M. Nakamura, N. Kimizuka, T. Mohri, and M. Isobe, "Homologous Series, Synthesis and Crystal Structure of $InFeO_3(ZnO)m$ (m: natural number) and its Isostructural Compound", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE,* 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE,* 2004, Vol. 432 pp. 488-492

SUMMARY OF THE INVENTION

The field effect mobility of a thin film transistor whose channel formation region is formed using an oxide semiconductor is higher than that of a thin film transistor whose channel region is formed using amorphous silicon. A pixel provided with such a thin film transistor formed using an oxide semiconductor is expected to be applied to a display device such as a liquid crystal display device, an electroluminescent display device, or electronic paper. However, a thin film transistor using an oxide semiconductor needs to be improved in terms of productivity as compared to a thin film transistor using amorphous silicon.

Thus, an object of the present invention is to improve productivity in manufacturing of a pixel provided with a thin film transistor using an oxide semiconductor.

An embodiment of the present invention is a display device including a gate electrode formed over a substrate, a gate insulating film formed over the gate electrode, a wiring and an electrode layer provided over the gate insulating film, and a high-resistance oxide semiconductor layer formed between the wiring and the electrode layer over the gate insulating film. In the display device, the wiring includes a first low-resistance oxide semiconductor layer and a first conductive layer over the first low-resistance oxide semiconductor layer, the electrode layer includes a second low-resistance oxide semiconductor layer and a second conductive layer covering a first portion of the second low resistance oxide semiconductor layer, and a second portion of the second low-resisitance oxide semiconductor layer is arranged to function as a pixel electrode.

Another embodiment of the present invention is a display device including a gate electrode formed over a substrate; a gate insulating film formed over the gate electrode; a high-resistance oxide semiconductor layer formed in an island shape over the gate insulating film, a wiring and an electrode layer provided over the gate insulating film and the high-resistance oxide semiconductor layer, and the high-resistance oxide semiconductor layer. In the display device, the wiring includes a first low-resistance oxide semiconductor layer and a first conductive layer over the first low-resistance oxide semiconductor layer, the electrode layer includes a second low-resistance oxide semiconductor layer and a second conductive layer covering a first portion of the second low-resistance oxide semiconductor layer, and a second portion of the second low-resistance oxide semiconductor layer is arranged to function as a pixel electrode.

Another embodiment of the present invention is a display device including a wiring and an electrode layer over a substrate, a high-resistance oxide semiconductor layer between the wiring and the electrode layer over the substrate, a gate insulating film formed over the high-resistance oxide semiconductor layer, and a gate electrode formed over the gate insulating film. In the display device, the wiring is includes a first low-resistance oxide semiconductor layer and a first conductive layer over the first low-resistance oxide semiconductor layer, the electrode layer includes a second low-resistance oxide semiconductor layer and a second conductive layer covering a first portion of the second low-resistance oxide semiconductor layer, and a second portion of the second low-resistance oxide semiconductor layer is arranged to function as a pixel electrode.

Another embodiment of the present invention is a display device including a high-resistance oxide semiconductor layer formed in an island shape over a substrate, a wiring and an electrode layer over the substrate and the high-resistance oxide semiconductor layer, a gate insulating film formed over the high-resistance oxide semiconductor layer, and a gate electrode formed over the gate insulating film. In the display device, the wiring includes a first low-resistance oxide semiconductor layer and a first conductive layer over the first low-resistance oxide semiconductor layer, the electrode layer includes a second low-resistance oxide semiconductor layer and a second conductive layer covering a first portion of the second low-resistance oxide semiconductor layer, and a second portion of the second low-resistance oxide semiconductor layer is arranged to function as a pixel electrode.

Another embodiment of the present invention is a method of manufacturing a display device, in which a gate electrode is formed over a substrate; a gate insulating film is formed over the gate electrode; a wiring and an electrode layer are formed over the gate insulating film by stacking a low-resistance oxide semiconductor layer and a conductive layer over the low-resistance oxide semiconductor layer; a high-resistance oxide semiconductor layer is formed between the wiring and the electrode layer over the gate insulating film; and a region of the conductive layer which corresponds to a region of the electrode layer functioning as a pixel electrode is etched, so that the low-resistance oxide semiconductor layer is exposed.

Another embodiment of the present invention is a method of manufacturing a display device, in which a gate electrode is formed over a substrate; a gate insulating film is formed over the gate electrode; a high-resistance oxide semiconductor layer is formed so as to have an island shape over the gate insulating film; a wiring and an electrode layer are formed over the gate insulating film and the high-resistance oxide semiconductor layer by stacking a low-resistance oxide semiconductor layer and a conductive layer over the low-resistance oxide semiconductor layer; and a region of the conductive layer which corresponds to a region of the electrode layer functioning as a pixel electrode is etched, so that the low-resistance oxide semiconductor layer is exposed.

Another embodiment of the present invention is a method of manufacturing a display device, in which a wiring and an electrode layer are formed over a substrate by stacking a low-resistance oxide semiconductor layer and a conductive layer over the low-resistance oxide semiconductor layer; a high-resistance oxide semiconductor layer is formed between the wiring and the electrode layer over the substrate; a gate insulating film is formed over the high-resistance oxide semiconductor layer; a gate electrode is formed over the gate insulating film; and a region of the conductive layer which corresponds to a region of the electrode layer functioning as a pixel electrode is etched, so that the low-resistance oxide semiconductor layer is exposed.

Another embodiment of the present invention is a method of manufacturing a display device, in which a high-resistance oxide semiconductor layer is formed so as to have an island shape over a substrate; a wiring and an electrode layer are formed over the substrate and the high-resistance oxide semiconductor layer by stacking a low-resistance oxide semiconductor layer and a conductive layer over the low-resistance oxide semiconductor layer; a gate insulating film is formed over the high-resistance oxide semiconductor layer; a gate electrode is formed over the gate insulating film; and a region of the conductive layer which corresponds to a region of the electrode layer functioning as a pixel electrode is etched, so that the low-resistance oxide semiconductor layer is exposed.

When a pixel provided with a thin film transistor in which an oxide semiconductor is used is manufactured, productivity can be improved. Accordingly, a display device having high electric characteristics can be provided at low cost.

DETAILED DESCRIPTION OF THE INVENTION

Figure 1A:
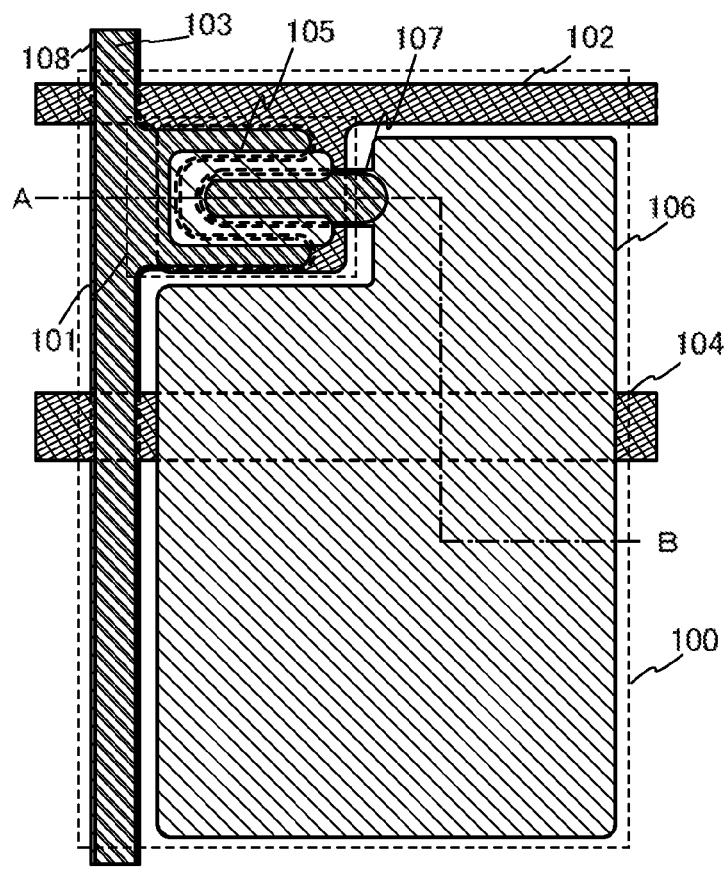
FIGS. 1A and 1B illustrate a manufacturing process of a display device.

The embodiments of the present invention will be described with reference to the drawings. Note that the present invention is not limited to the following description because it will be easily understood by those skilled in the art that various changes and modifications can be made without departing from the spirit and scope of the present invention. Therefore, the present invention to be disclosed is not interpreted as being limited to the description of Embodiments below. Note that, in the structure of the invention described hereinafter, the same reference numerals denote the same parts or parts having the similar functions in different drawings and the explanation will not be repeated.

Note that in each drawing described in this specification, a size of each component or a thickness of each layer or an area is exaggerated in some cases for clarification. Therefore, a scale is not necessarily limited to a scale in the drawings.

Note that the terms such as "first", "second", and "third" used in this specification are used just to avoid confusion of structural elements and do not mean limitation of the number of the structural elements. Therefore, for example, description can be made even when "first" is replaced with "second" or "third", as appropriate.

Embodiment 1

An example is described below in which a pixel of a display device is formed using a thin film transistor. In this embodiment, a thin film transistor (hereinafter, also referred to as a TFT) included in a pixel of a liquid crystal display device, and an electrode functioning as a pixel electrode (simply, also referred to as a pixel electrode) connected to the TFT are described as examples. Note that the structure described in this embodiment can be applied to not only liquid crystal display devices but also any display devices as long as a transistor is connected to an electrode functioning as a pixel electrode. Note that a pixel refers to an element group which includes elements provided in each pixel of a display device, for example, an element for controlling display in accordance with electric signals, such as a thin film transistor, an electrode functioning as a pixel electrode, or a wiring. Note that a pixel may include a color filter, a display element, and the like, and may correspond to one color component whose illuminance can be controlled. Therefore, for example, in the case of a color display device including color components of R, G, and B, a minimum unit of an image includes three pixels of R, G, and B and an image can be obtained by a plurality of pixels.

Note that when it is described that "A and B are connected to each other", the case where A and B are electrically connected to each other, and the case where A and B are directly connected to each other are included therein. Here, each of A and B corresponds to an object (e.g., a device, an element, a circuit, a wiring, an electrode, a terminal, a conductive film, or a layer).

Note that a display device refers to a device including a display element whose contrast, illuminance, reflectivity, transmittivity, or the like is changed by an electromagnetic action, for example, an EL (electroluminescence) element (an EL element including an organic substance and an inorganic substance, an organic EL element, or an inorganic EL element), an electron emitter, a liquid crystal element, an electronic ink, and an electrophoretic element.

First of all, a top view of the pixel is illustrated in FIG. 1A. Note that a TFT illustrated in FIG. 1A has a bottom-gate structure and a so-called coplanar structure (also referred to as a bottom-contact structure) in which wiring layers to be a source electrode and a drain electrode of the TFT are provided between an oxide semiconductor layer to be a channel region and a wiring to be a gate. In a pixel 100 illustrated in FIG. 1A, the following is provided: a wiring 102 (also referred to as a gate wiring or a first wiring) connected to a gate of a TFT 101; a wiring 103 (also referred to as a source wiring) connected to an electrode (also referred to as a first terminal, a second wiring, or a source electrode) of the TFT 101; a wiring 104 (also referred to as a capacitor wiring or a third wiring) provided for the same layer as the wiring 102 to keep a voltage to be applied to a liquid crystal element that is a display element; an oxide semiconductor layer 105 formed in an island shape; an oxide semiconductor layer 106 functioning as a pixel electrode; and an electrode 107 (also referred to as a second terminal or a drain electrode) overlapping with the oxide semiconductor layer 106 and provided for the same layer as the wiring 103. Further, the wiring 103 overlaps with a wiring of an oxide semiconductor layer 108 provided for the same layer as the oxide semiconductor layer 106.

Figure 1B:
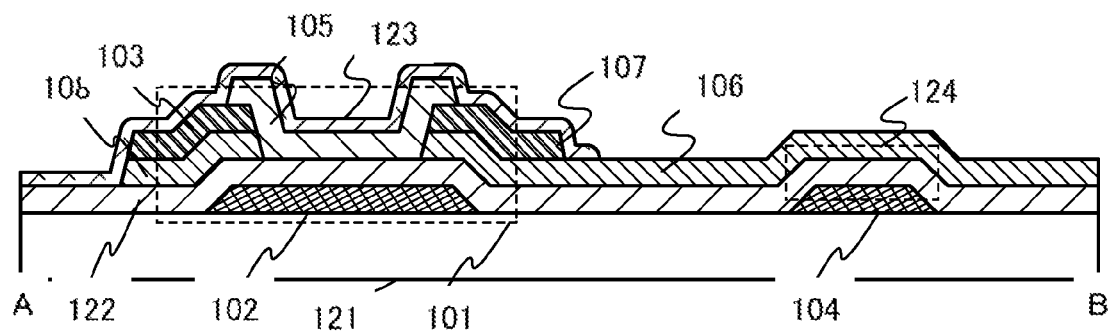

FIG. 1B illustrates a cross-sectional structure taken along chain line A-B of FIG. 1A. In the cross-sectional structure illustrated in FIG. 1B, the wiring 102 that is the gate wiring and the wiring 104 that is the capacitor wiring are provided over a substrate 121. A gate insulating film 122 is provided to cover the wiring 102 and the wiring 104. The oxide semiconductor layer 106 and the oxide semiconductor layer 108 are provided over the gate insulating film 122. Over the oxide semiconductor layer 106, the electrode 107 is provided in a region to be connected to the TFT 101. The wiring 103 is provided over the oxide semiconductor layer 108. The oxide semiconductor layer 105 is provided in a region between the wiring 103 and the electrode 107 over the wiring 102 with the gate insulating film 122 interposed between the oxide semiconductor layer 105 and the wiring 102. An insulating layer 123 functioning as a passivation film is provided to cover the TFT 101. The oxide semiconductor layer 106, the wiring 104, and the gate insulating film 122 serving as a dielectric form a storage capacitor 124.

Figure 2:
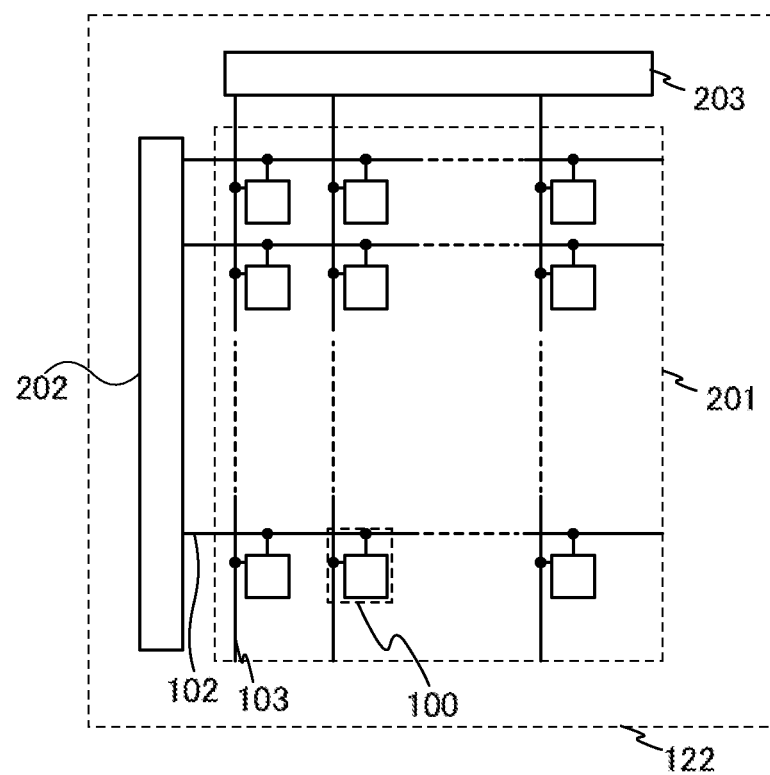
FIG. 2 illustrates a manufacturing process of a display device.

Note that the pixel illustrated in FIGS. 1A and 1B corresponds to one of a plurality of pixels 100 arranged in matrix over the substrate 121 as illustrated in FIG. 2. FIG. 2 illustrates a structure in which a pixel portion 201, a gate line driving circuit 202, and a source line driving circuit 203 are provided over the substrate 121. Whether the pixels 100 are in a selected state or in a non-selected state is determined per line in accordance with a scanning signal supplied from the wiring 102 connected to the gate line driving circuit 202. The pixel 100 selected by the scanning signal is supplied with a video voltage (also referred to as a video signal or video data) through the wiring 103 connected to the source line driving circuit 203.

FIG. 2 illustrates the structure in which the gate line driving circuit 202 and the source line driving circuit 203 are provided over the substrate 121. Alternatively, another structure may be employed in which either the gate line driving circuit 202 or the source line driving circuit 203 is provided over the substrate 121. Further alternatively, only the pixel portion 201 may be provided over the substrate 121.

FIG. 2 illustrates an example in which the plurality of pixels 100 are arranged in matrix (in stripe) in the pixel portion 201. Note that the pixels 100 are not necessarily provided in matrix. Alternatively, for example, the pixels 100 may be arranged in a delta pattern or Bayer arrangement. As a display method of the pixel portion 201, either a progressive method or an interlace method can be employed. Note that the color components controlled in the pixel at the time of color display are not limited to three colors of R, G, and B (R, G, and B correspond to red, greed, and blue, respectively) and color components of more than three colors may be employed, for example, R, G, B, and W (W corresponds to white); R, G, B, and one or more of yellow, cyan, magenta, and the like; or the like. Further, the sizes of display regions may be different between respective dots of color elements.

In FIG. 2, the number of the wirings 102 and the wirings 103 corresponds to the number of the pixels in a column direction and a row direction. Note that the number of the wirings 102 and the number of the wirings 103 may be increased depending on the number of sub-pixels included in the pixels or the number of the transistors in the pixel. Alternatively, the pixel 100 may be driven by the wiring 102 and the wiring 103 which are used in common between the pixels.

Figure 3A:
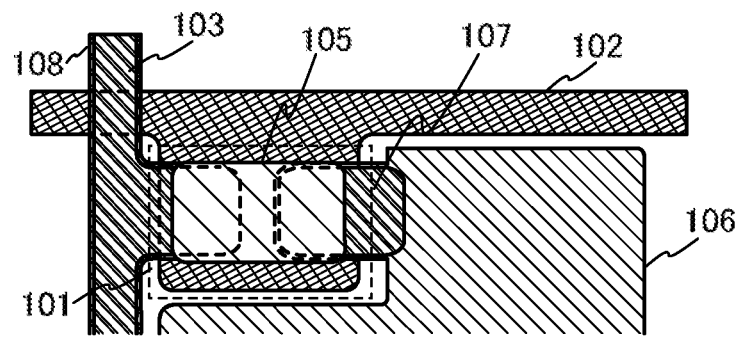
FIGS. 3A, 3B, and 3C each illustrate a manufacturing process of a display device.
Figure 3B:
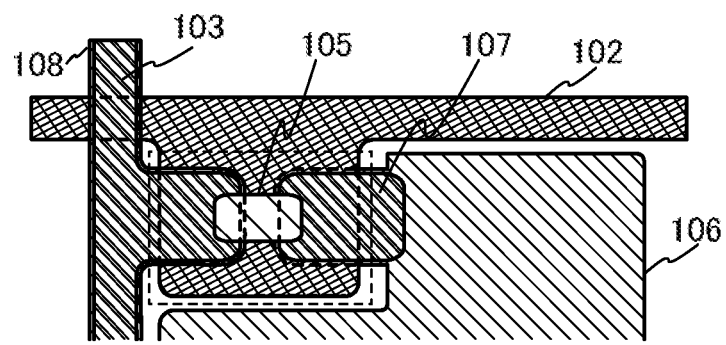
Figure 3C:
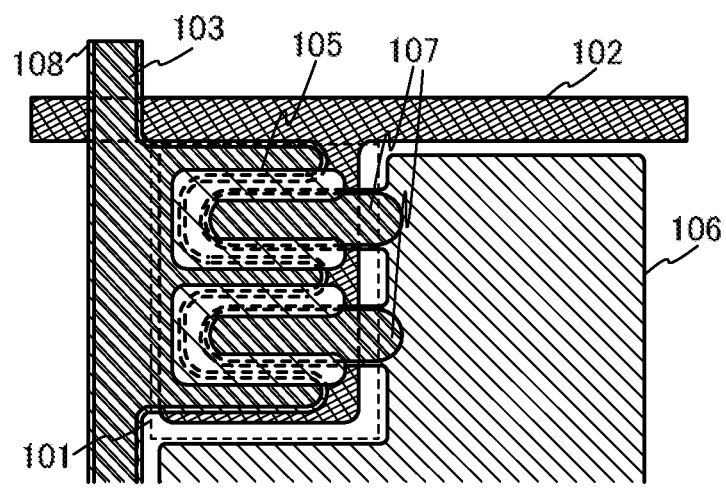

Note that in FIG. 1A, the TFT is formed to have a shape so that the wiring 103 surrounds the electrode 107 (particularly, a U-shape or a C-shape), whereby an area through which carriers are transferred is increased and the amount of flowing current is increased. Alternatively, another shape may be employed. For example, such a structure illustrated in FIG. 3A may be employed in which the oxide semiconductor layer 105 is formed in a rectangular shape, and the wiring 103 and the electrode 107 are arranged in approximately parallel to each other with the oxide semiconductor layer 105 interposed therebetween. In addition, such a structure illustrated in FIG. 3B may be employed in which the oxide semiconductor layer 105 is formed in a rectangular shape in a manner similar to FIG. 3A, and the oxide semiconductor layer 105 is formed to be smaller than the wiring 103 and the electrode 107. As illustrated in FIGS. 3A and 3B, by changing the size of the oxide semiconductor layer 105, the amount of current flowing through the TFT 101 can be controlled. Further, as illustrated in FIG. 3C, by changing the shapes of the wiring surrounding the electrode and the electrode surrounded by the wiring and increasing the number thereof in the structure described in FIG. 1A, in which the wiring 103 surrounds the electrode 107, the area through which carriers are transferred can be further increased and the amount of flowing current can be increased. In FIGS. 3A to 3C, the size of the wiring 102 is formed to be larger than that of the oxide semiconductor layer 105, so that the oxide semiconductor layer 105 can be sufficiently shielded against light and variation in characteristics of the TFT due to photosensitivity can be reduced.

Note that the TFTs illustrated in FIG. 1A and FIGS. 3A to 3C can have various structures. For example, a multi-gate structure with two or more of gates can be employed. In a multi-gate structure, channel regions are connected in series. Accordingly, the structure is that in which a plurality of transistors are connected in series. With the multi-gate structure, off-current can be reduced and the withstand voltage of the transistor can be increased (improvement of reliability).

Note that a TFT is an element having at least three terminals of a gate, a drain, and a source. The TFT includes a channel region between a drain region and a source region, and current can flow through the drain region, the channel region, and the source region. Here, since the source and the drain of the transistor may change depending on the structure, the operating condition, and the like of the transistor, it is difficult to define which is a source or a drain. Therefore, a region functioning as the source and the drain is not called the source or the drain in some cases. In such a case, for example, one of the source and the drain is described as a first terminal and the other thereof is described as a second terminal in some cases. Alternatively, one of the source and the drain may be referred to as a first electrode and the other thereof may be referred to as a second electrode. Further alternatively, one of the source and the drain may be referred to as a first region and the other thereof may be called a second region.

Next, based on the top view and the cross-sectional view illustrated in FIGS. 1A and 1B, a method of manufacturing the pixel is described with reference to FIGS. 4A to 4E, FIG. 5, FIG. 6, FIG. 7, FIG. 8, and FIG. 9.

First, as the substrate 121 having a light-transmitting property, a glass substrate such as barium borosilicate glass, aluminoborosilicate glass, or the like typified by #7059 glass, #1737 glass, or the like manufactured by Corning Incorporated can be used. Note that a base film may be provided over the substrate 121 to prevent diffusion of impurities from the substrate 121 or improve adhesion between elements provided over the substrate 121.

Figure 4A:
FIGS. 4A, 4B, 4C, 4D, and 4E illustrate a manufacturing process of the display device.

Next, a conductive layer is formed over the entire surface of the substrate 121. After that, a first photolithography step is performed, so that a resist mask is formed. Then, unnecessary portions of the conductive layer are etched, so that the first wiring and the like (the wiring 102 to be a gate electrode and the wiring 104 to be the capacitor wiring) are formed. At this time, the etching is performed so that at least an edge portion of the wiring 102 has a tapered shape. A cross-sectional view at this stage is illustrated in FIG. 4A. Note that a top view at this stage corresponds to FIG. 5.

The wiring 102 and the wiring 104 are preferably formed using a low-resistant conductive material such as aluminum (Al) or copper (Cu). However, aluminum alone has the disadvantages of low heat resistance, being easily corroded, and the like. Thus, aluminum is used in combination with a conductive material having heat resistance. As the conductive material having heat resistance, it is possible to use an element selected from titanium (Ti), tantalum (Ta), tungsten (W), molybdenum (Mo), chromium (Cr), neodymium (Nd), and scandium (Sc); an alloy including any of these elements as its component; an alloy including a combination of any of these elements; or a nitride including any of these elements as its component.

Note that the wirings and the like included in the TFT can be formed by an inkjet method or a printing method. Accordingly, the TFT can be formed at room temperature, formed at a low vacuum, or formed using a large substrate. Also, since the TFT can be manufactured without using a photomask, a layout of the transistor can be changed easily. Further, since it is not necessary to use a resist, material cost is reduced and the number of steps can be reduced. In addition, a resist mask and the like can also be formed by employing an inkjet method or a printing method. When a resist is formed over only necessary portions by an inkjet method or a printing method to be used as a resist mask for exposure and development, cost can be further reduced than in the case of forming a resist over the entire surface.

Alternatively, a resist mask having regions with a plurality of thicknesses (typically, two kinds of thicknesses) may be formed using a multi-tone mask to form the wirings.

Next, an insulating film (the gate insulating film 122) is formed over the entire surfaces of the wiring 102 and the wiring 104. The gate insulating film 122 is formed by a sputtering method or the like.

For example, the gate insulating film 122 is formed using a silicon oxide film by a sputtering method. Needless to say, the gate insulating film 122 is not limited to such a silicon oxide film and may be a single layer or a stack of layers including another insulating film such as a silicon oxynitride film, a silicon nitride film, an aluminum oxide film, or a tantalum oxide film.

Note that preferably, before the formation of an oxide semiconductor film, dust attached to a surface of the gate insulating film 122 is removed by reverse sputtering in which an argon gas is introduced to generate plasma. Note that instead of an argon atmosphere, a nitrogen atmosphere, a helium atmosphere, or the like may be used. Alternatively, an argon atmosphere to which oxygen, hydrogen, $N_2O$, or the like is added may be used. Further alternatively, an argon atmosphere to which $Cl_2$, $CF_4$, or the like is added may be used.

Next, after plasma treatment is performed on the surface of the gate insulating film 122, a low-resistance oxide semiconductor film (in this embodiment, also referred to as a first oxide semiconductor film, or an $n^+$ layer) is formed over the gate insulating film 122 without being exposed to the atmosphere. Note that, as the low-resistance oxide semiconductor film, an In—Ga—Zn—O-based non-single-crystal film is used. Here, sputtering is performed using a target of $In_2O_3$:$Ga_2O_3$:ZnO=1:1:1 under deposition conditions where the pressure is 0.4 Pa, the power is 500 W, the deposition temperature is room temperature, and an argon gas is introduced at a flow rate of 40 sccm. Despite the intentional use of the target in which the ratio of $In_2O_3$:$Ga_2O_3$:ZnO=1:1:1, an In—Ga—Zn—O-based non-single-crystal film including crystal grains with a size of 1 nm to 10 nm immediately after the film formation is formed in some cases. Note that it can be said that the presence or absence of crystal grains or the density of crystal grains can be adjusted and the diameter size can be adjusted within the range of 1 nm to 10 nm by appropriate adjustment of the composition ratio in the target, the film deposition pressure (0.1 Pa to 2.0 Pa), the power (250 W to 3000 W:8 inches Ø), the temperature (room temperature to 100° C.), the deposition conditions for reactive sputtering, or the like.

The low-resistance oxide semiconductor film may be formed in the same chamber as the chamber in which the reverse sputtering is performed previously, or may be formed in a different chamber from the chamber where the reverse sputtering is performed previously.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a conductive film is formed from a metal material over the low-resistance oxide semiconductor film by a sputtering method or a vacuum evaporation method. As the material of the conductive film, there are an element selected from Al, Cr, Ta, Ti, Mo, and W, an alloy containing any of these elements as its component, an alloy containing a combination of any of these elements, and the like. Further, for heat treatment at 200° C. to 600° C., the conductive film preferably has heat resistance for such heat treatment. Since Al alone has the disadvantages of low heat resistance, being easily corroded, and the like, it is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), and neodymium (Nd), scandium (Sc), an alloy containing any of these elements as its component, an alloy containing a combination of any of these elements, and a nitride containing any of these elements as its component.

Here, the conductive film has a single-layer structure of a titanium film. Alternatively, the conductive film may have a two-layer structure in which a titanium film is stacked on an aluminum film. Still alternatively, the conductive film may have a three-layer structure in which a Ti film, an aluminum film including Nd (Al—Nd), and a Ti film is stacked in this order. Further alternatively, the conductive film may have a single-layer structure of an aluminum film including silicon.

Figure 4B:
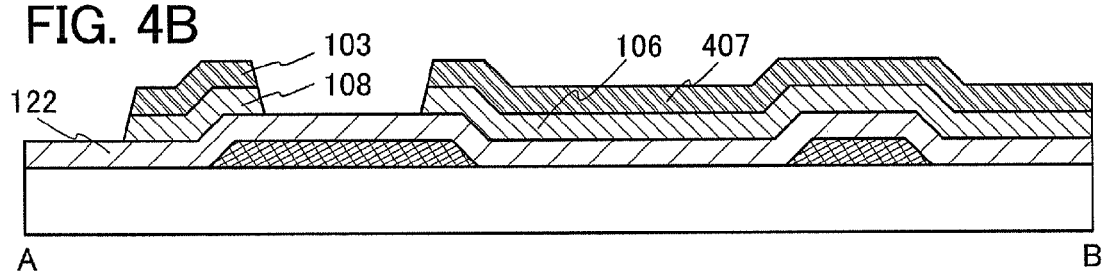

Next, a second photolithography step is performed to form a resist mask. Then, unnecessary portions are etched, so that the oxide semiconductor layer 108 and the oxide semiconductor layer 106, which are formed from the low-resistance oxide semiconductor film, and the wiring 103 and a conductive layer 407, which are formed from the conductive film, are formed. Note that a layer in which the oxide semiconductor layer 108 formed from the low-resistance oxide semiconductor film and the wiring 103 formed from the conductive film are stacked is referred to as a second wiring, and a layer in which the oxide semiconductor layer 106 and the conductive layer 407 are stacked is referred to as an electrode layer. Wet etching or dry etching is used as an etching method at this time. For example, by wet etching using an ammonia hydrogen peroxide mixture (hydrogen peroxide:ammonia:water=5:2:2), the conductive film of the Ti film is etched to form the wiring 103 and the conductive layer 407, and the low-resistance oxide semiconductor film is etched to form the oxide semiconductor layer 108 and the oxide semiconductor layer 106. In FIG. 4B, since etching of the conductive film and etching of the low-resistance oxide semiconductor film are performed at one time using an etchant of an ammonia hydrogen peroxide mixture, edge portions of the oxide semiconductor layer 108 and the oxide semiconductor layer 106 are aligned with edge portions of the wiring 103 and the conductive layer 407 respectively to form a continuous structure. A cross-sectional view at this stage is illustrated in FIG. 4B. Note that a top view at this stage corresponds to FIG. 6.

Next, a high-resistance oxide semiconductor film (a second oxide semiconductor film in this embodiment) is formed over the gate insulating film 122, the wiring 103, and the conductive layer 407. Note that, as the high-resistance oxide semiconductor film, an In—Ga—Zn—O-based non-single-crystal film is used. Here, sputtering is performed using a target of $In_2O_3:Ga_2O_3:ZnO=1:1:1$ under deposition conditions where the pressure is 0.4 Pa, the power is 500 W, and an argon gas and an oxygen gas are introduced at flow rates of 10 sccm and 5 sccm, respectively. Note that it is preferable to use a pulsed direct-current (DC) power source with which dust can be reduced and thickness distribution can be evened.

The deposition conditions of the high-resistance oxide semiconductor film and those of the low-resistance oxide semiconductor film are different from each other. For example, a ratio of a flow rate of an oxygen gas to a flow rate of argon gas in the deposition conditions of the high-resistance oxide semiconductor film is higher than that in the deposition conditions of the low-resistance oxide semiconductor film. Specifically, the low-resistance oxide semiconductor film is deposited in a rare gas (such as argon or helium) atmosphere (or an atmosphere including oxygen at 10% or less and an argon gas at 90% or more), and the high-resistance oxide semiconductor film is deposited in an oxygen atmosphere (or an atmosphere including an argon gas and an oxygen gas at a flow rate ratio of 1:1 or more). Note that, the low-resistance oxide semiconductor film may be formed in such a manner that a high-resistance oxide semiconductor film is formed and then the film is doped with hydrogen or the like to be reformed.

Note that the high-resistance oxide semiconductor and the low-resistance oxide semiconductor are represented by $InMO_3(ZnO)_m$ (m>0). Note that M denotes one or more of metal elements selected from gallium (Ga), iron (Fe), nickel (Ni), manganese (Mn), and cobalt (Co). In addition to a case where only Ga is included as M, there is a case where Ga and any of the above metal elements other than Ga, for example, Ga and Ni or Ga and Fe are included as M. Moreover, in the oxide semiconductor, in some cases, a transition metal element such as Fe or Ni or an oxide of the transition metal is included as an impurity element in addition to a metal element included as M. In this specification, this thin film is also referred to as an "In—Ga—Zn—O-based non-single-crystal film".

An amorphous structure of the In—Ga—Zn—O-based non-single-crystal film can be observed by X-ray diffraction (XRD) even though heat treatment is performed at 200° C. to 500° C., typically 300° C. to 400° C. for 10 minutes to 100 minutes after the In—Ga—Zn—O-based non-single-crystal film is formed by a sputtering method. In addition, a TFT in which the high-resistance oxide semiconductor is used for a channel region and which has electric characteristics such as an on/off ratio of greater than or equal to $10^9$ and a mobility of greater than or equal to 10 at a gate voltage of ±20 V can be manufactured. A thin film transistor having such electric characteristics which is formed using an oxide semiconductor film has higher mobility than a thin film transistor formed using amorphous silicon, and the thin film transistor formed using an oxide semiconductor film, which is provided in a pixel portion can be driven at high speed. In addition, the resistivity of an In—Ga—Zn—O-based non-single-crystal film can be changed by adjusting the composition ratio in the target, the film deposition pressure, power, temperature, deposition conditions for reactive sputtering, or the like, in a manner similar to the above-described high-resistance oxide semiconductor and the low-resistance oxide semiconductor.

Note that in this embodiment, the In—Ga—Zn—O-based non-single-crystal film is exemplified as the high-resistance oxide semiconductor and the low-resistance oxide semiconductor. Alternatively, another oxide semiconductor may be used for the high-resistance oxide semiconductor and the low-resistance oxide semiconductor as long as the resistivity of the oxide semiconductor is changed by changing its component ratio depending on a deposition method and the oxide semiconductor has a light-transmitting property. For example, a Zn—O-based oxide semiconductor, an In—Ti—O-based oxide semiconductor, an In—Zn—O-based oxide semiconductor, or an Al—Zn—Sn—O-based oxide semiconductor may be used.

Figure 4C:
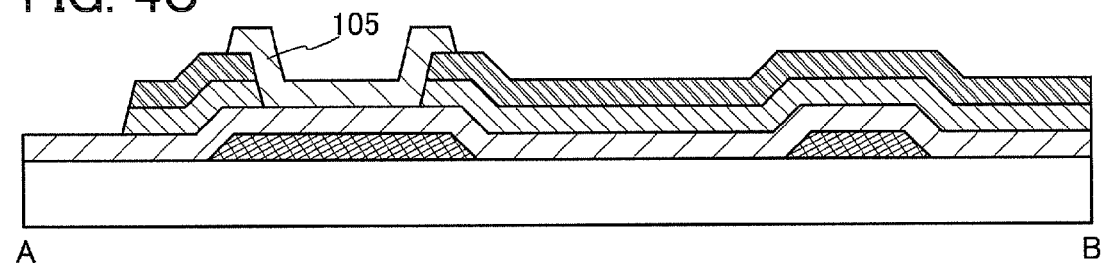

Next, a third photolithography step is performed to form a resist mask, and the high-resistance oxide semiconductor film is etched. By wet etching or dry etching, unnecessary portions are removed, so that the oxide semiconductor layer 105 is formed. A cross-sectional view at this stage is illustrated in FIG. 4C. Note that a top view at this stage corresponds to FIG. 7.

Figure 4D:
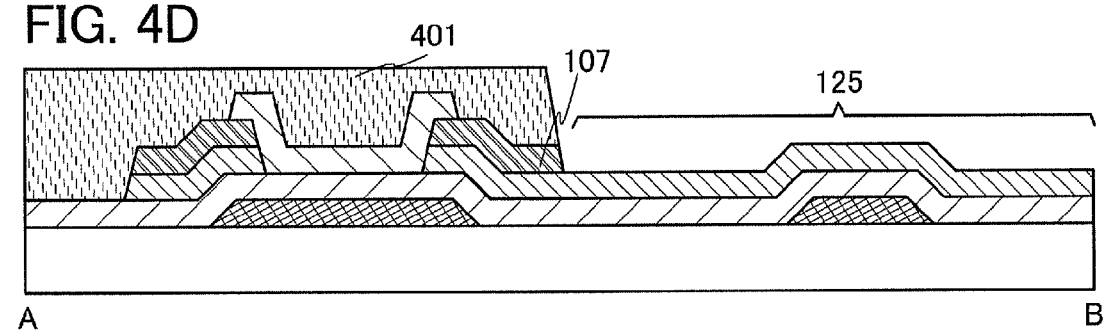

Next, a fourth photolithography step is performed to form a resist mask 401, and unnecessary portions of the conductive layer 407 included in the electrode layer corresponding to a region of the electrode layer functioning as the pixel electrode are etched. Then, part of the low-resistance oxide semiconductor layer 106 overlapping with the conductive layer 407 is exposed, so that a pixel electrode 125 is formed. A cross-sectional view at this stage is illustrated in FIG. 4D. A top view at this stage corresponds to FIG. 8.

Note that when the oxide semiconductor layer 108 and the oxide semiconductor layer 106 are provided, a junction between the wiring 103 and the electrode 107 which are conductive layers and the oxide semiconductor layer 105 is favorable and achieves higher operation stability also in terms of heat than Schottky junction. In addition, it is effective to positively provide the low-resistance oxide semiconductor layer in the TFT 101 in order that a resistance component is not formed at an interface with the first terminal to be the source supplying carriers of the channel or the second terminal to be the drain absorbing the carriers of the channel. Further, with the low-resistance oxide semiconductor layer, the TFT can have favorable mobility even when a drain voltage is high.

Note that heat treatment is preferably performed at 200° C. to 600° C., typically, 300° C. to 500° C. after formation of the oxide semiconductor layer 105. Here, heat treatment is performed in a nitrogen atmosphere in a furnace at 350° C. for 1 hour. This heat treatment allows atoms of the oxide semiconductor layer 105 to be rearranged. Because strain which inhibits carrier movement is released by this heat treatment, this heat treatment (including optical annealing) is important. There is no particular limitation on timing of the heat treatment as long as it is performed after formation of the oxide semiconductor layer 105. For example, the heat treatment may be performed after formation of the conductive layer 407.

Moreover, a channel region of the oxide semiconductor layer 105 which is exposed may be subjected to oxygen radical treatment. By the oxygen radical treatment, the thin film transistor can be normally off. In addition, by the radical treatment, damage of the oxide semiconductor layer 105 due to etching can be repaired. The radical treatment is preferably performed in an atmosphere of $O_2$ or $N_2O$, or an atmosphere of $N_2$, He, or Ar each including oxygen.

Figure 4E:
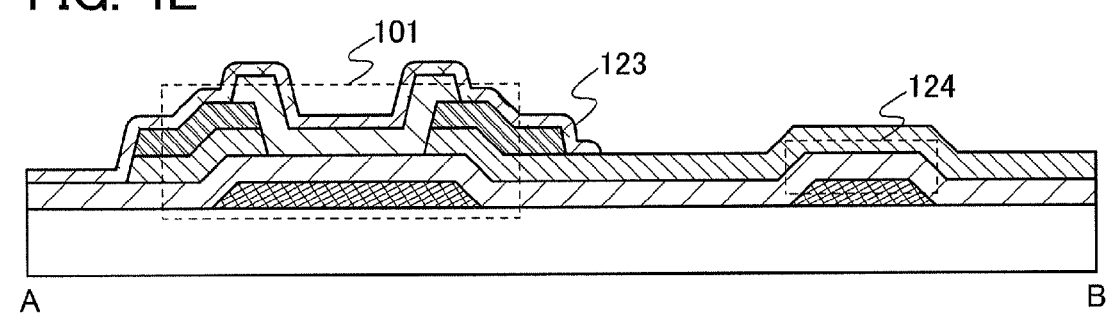
Figure 5:
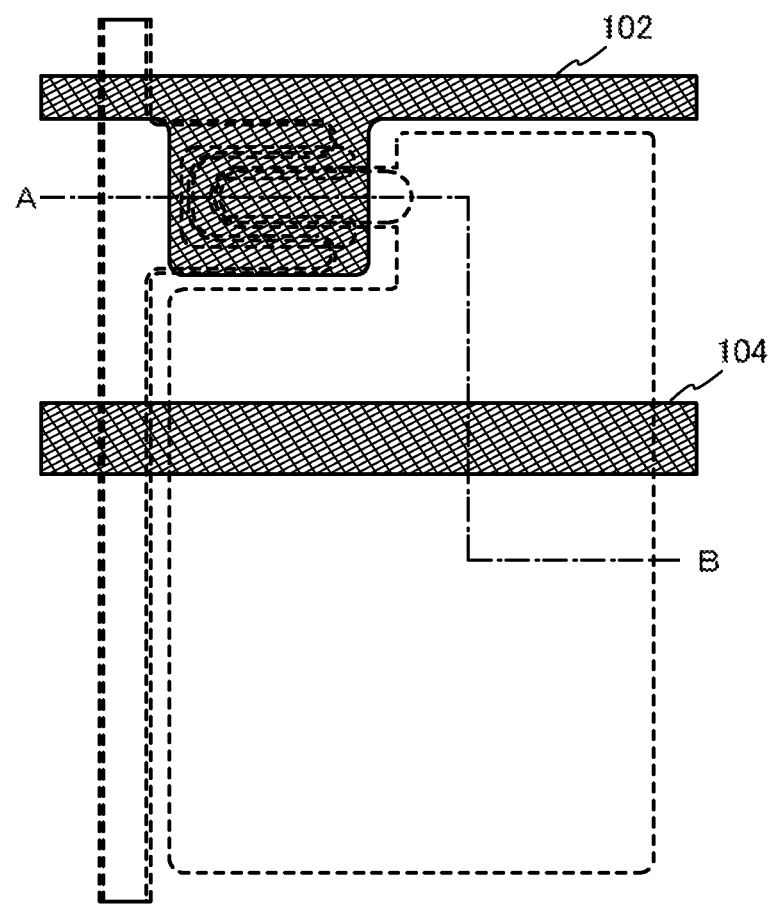
FIG. 5 illustrates the manufacturing process of the display device.
Figure 6:
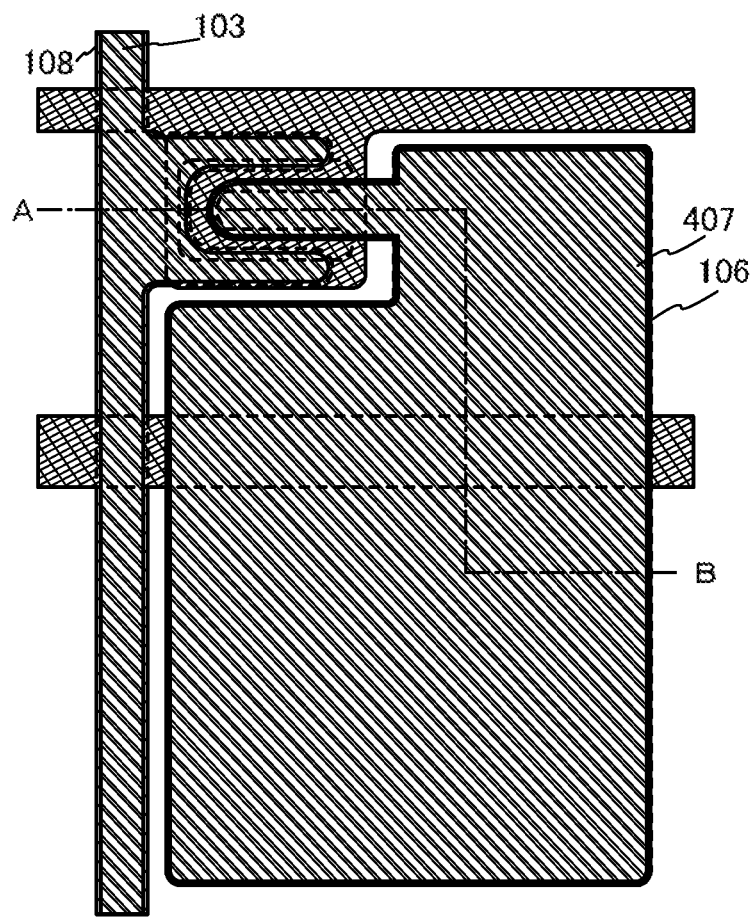
FIG. 6 illustrates the manufacturing process of the display device.
Figure 7:
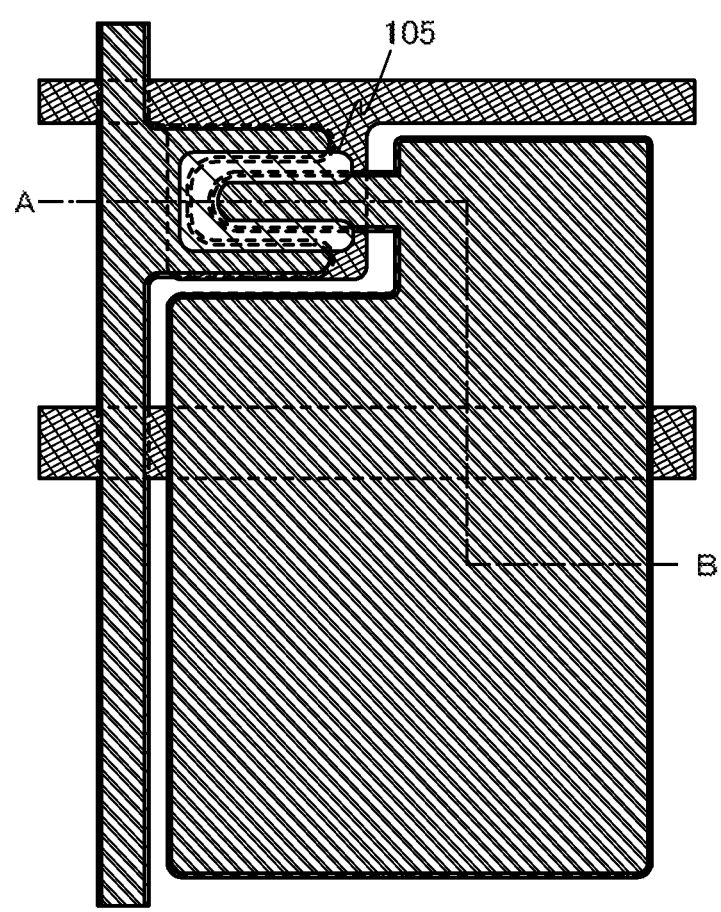
FIG. 7 illustrates the manufacturing process of the display device.
Figure 8:
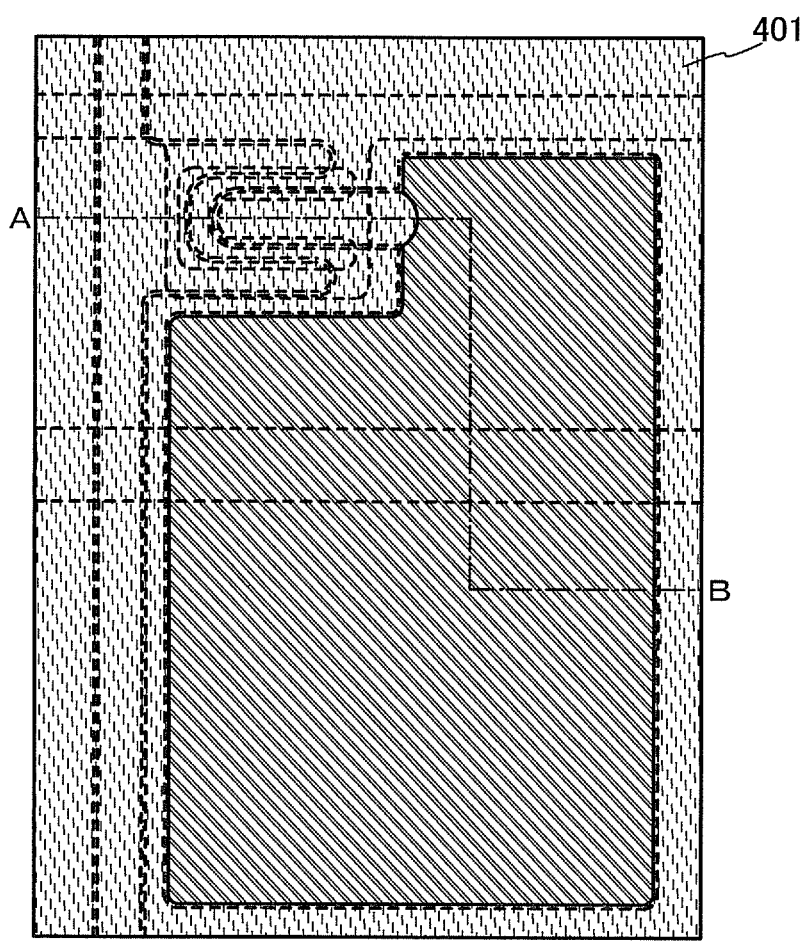
FIG. 8 illustrates the manufacturing process of the display device.
Figure 9:
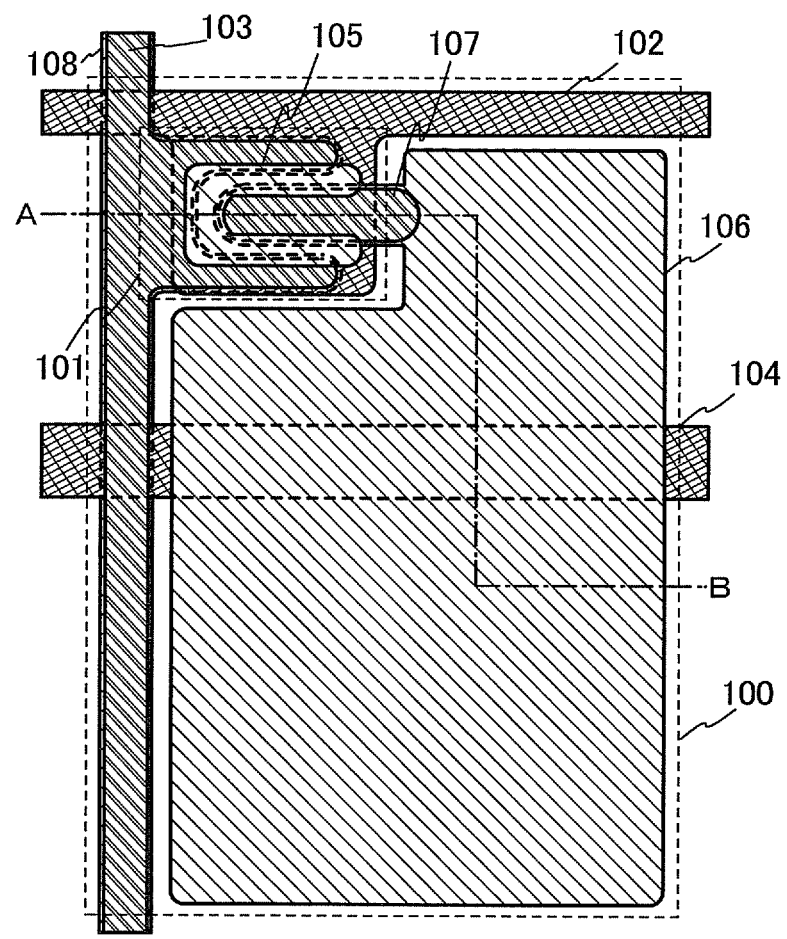
FIG. 9 illustrates the manufacturing process of the display device.

Next, the resist mask 401 is removed and an insulating layer is formed. Then, a fifth photolithography step is performed to form a resist mask, and the insulating layer is etched to form the insulating layer 123 covering the TFT 101. As the insulating layer, a silicon nitride film, a silicon oxide film, a silicon oxynitride film, an aluminum oxide film, a tantalum oxide film, or the like which is obtained by a sputtering method or the like can be used. The insulating layer may be a single layer or a stack of layers formed from any of these materials. The gate insulating film 122 serving as a dielectric, the wiring 104, and the oxide semiconductor layer 106 form the storage capacitor 124 in a region overlapping with the wiring 104. A cross-sectional view at this stage is illustrated in FIG. 4E. Note that a top view at this stage is illustrated in FIG. 9.

In this manner, the pixel provided with the bottom-gate bottom-contact n-channel TFT 101 can be formed. These are arranged in matrix in respective pixels so that a pixel portion is formed, which can be used as one of boards for manufacturing an active matrix display device. In this specification, such a substrate is referred to as an active matrix substrate for convenience.

In an active-matrix liquid crystal display device, pixel electrodes arranged in matrix are driven, so that a display pattern is formed on a screen. In more detail, when a voltage is applied between a selected pixel electrode and a counter electrode that corresponds to the selected pixel electrode, a liquid crystal layer provided between the pixel electrode and the counter electrode is optically modulated, and this optical modulation is recognized as a display pattern by an observer. A display element such as a liquid crystal element is provided over the oxide semiconductor layer 106 functioning as the pixel electrode.

Figure 10A:
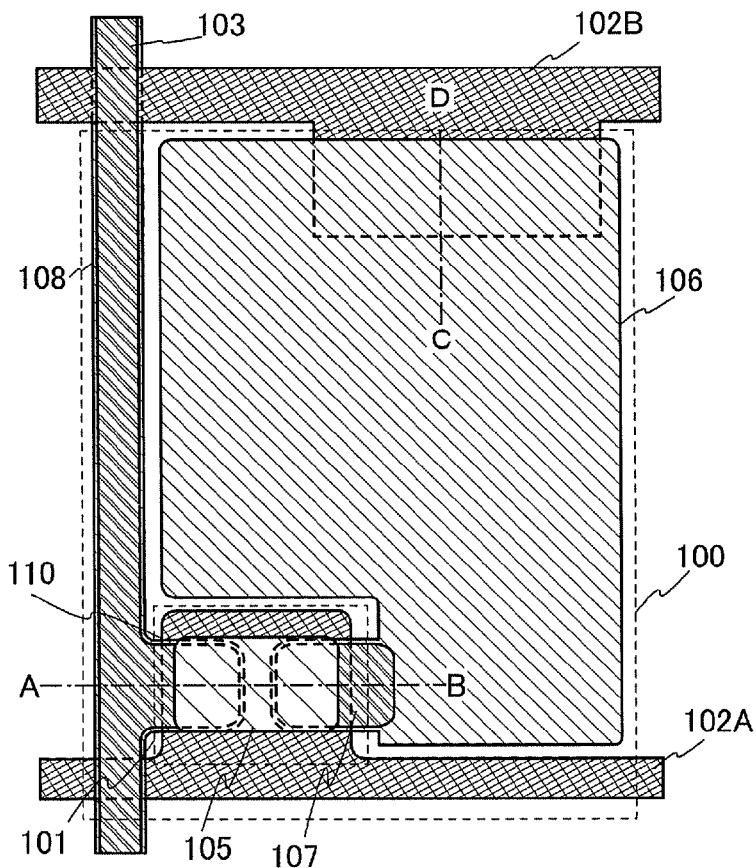
FIGS. 10A and 10B illustrate a manufacturing process of a display device.
Figure 10B:
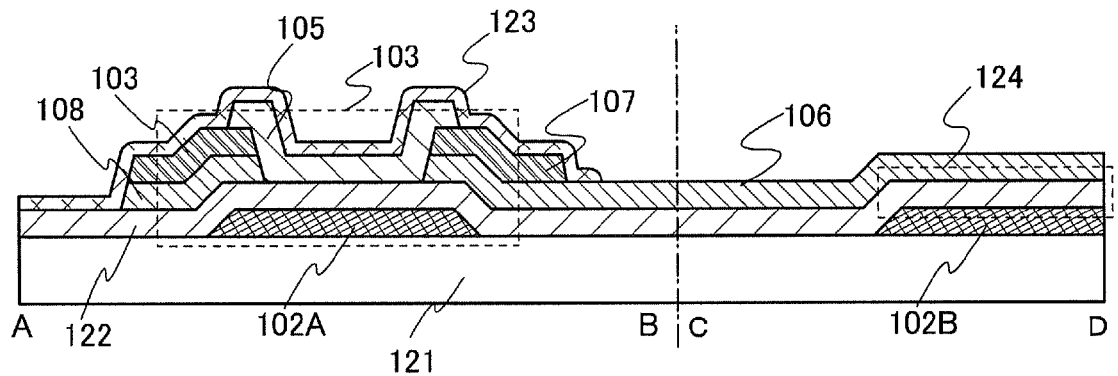

This embodiment is not limited to the pixel illustrated in FIGS. 1A and 1B. Alternatively, another structure may be employed. As an example, a top view and a cross-sectional view which are different from FIGS. 1A and 1B are illustrated in FIGS. 10A and 10B. Note that FIG. 10B illustrates a cross-sectional structure taken along chain lines A-B and C-D of FIG. 10A. FIGS. 10A and 10B illustrate an example in which the oxide semiconductor layer 106 functioning as the pixel electrode and a wiring functioning as a gate line of an adjacent pixel overlap with each other with the gate insulating film 122 interposed between the oxide semiconductor layer 106 and the wiring functioning as the gate line of the adjacent pixel, so that the storage capacitor 124 is formed without a capacitor wiring. In this case, the wiring 104 functioning as the capacitor wiring illustrated in FIGS. 1A and 1B can be omitted. Note that in FIGS. 10A and 10B, the same portions as those in FIGS. 1A and 1B are denoted by the same reference numerals and description thereof is the same as that of FIGS. 1A and 1B. In FIGS. 10A and 10B, a wiring 102A functioning as a gate line and a wiring 102B functioning as a gate line of a pixel which is prior to a pixel including the wiring 102A form a storage capacitor. Therefore, since a capacitor wiring does not need to be provided, an aperture ratio can be improved.

Figure 11A:
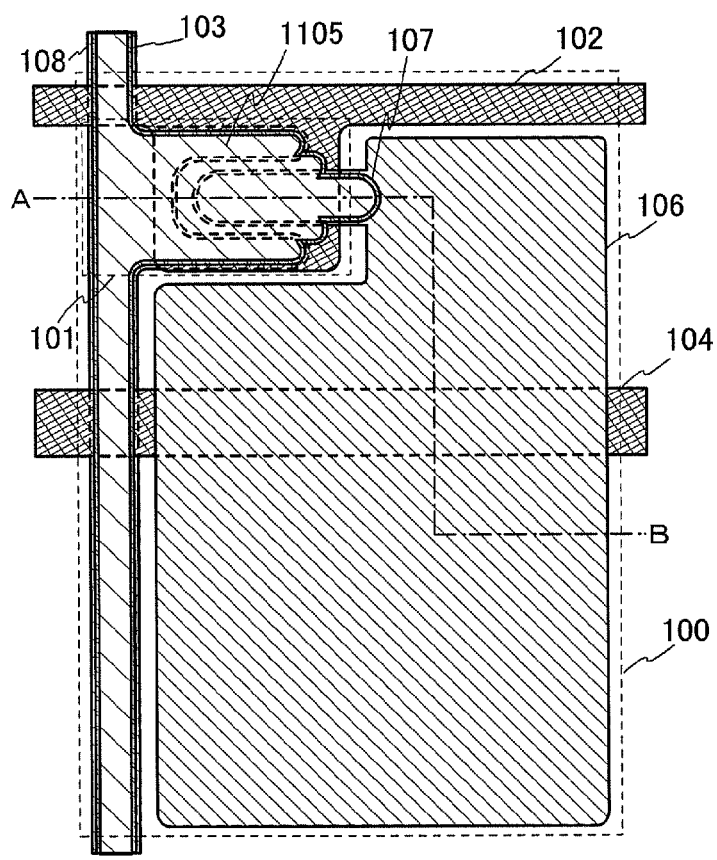
FIGS. 11A and 11B illustrate a manufacturing process of a display device.
Figure 11B:
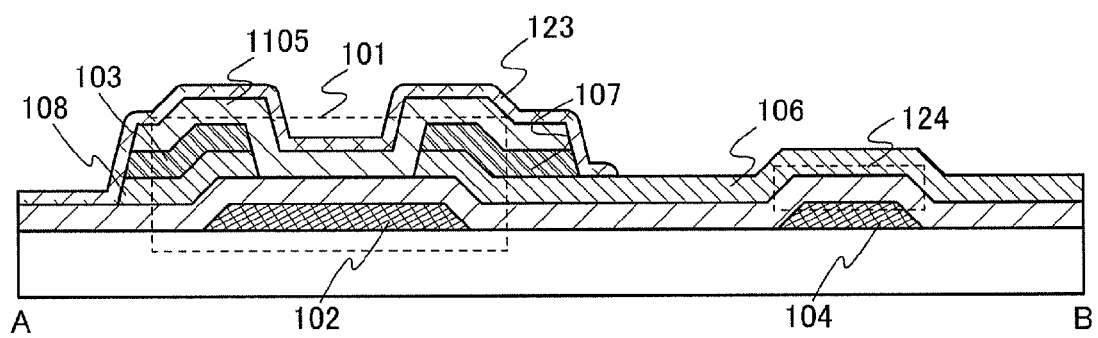

This embodiment is not limited to the pixel structure of FIGS. 1A and 1B. Alternatively, another structure may be employed. As an example, a top view and a cross-sectional view which are different from FIGS. 1A and 1B are illustrated in FIGS. 11A and 11B. In FIGS. 11A and 11B, the unnecessary portion of the conductive layer 407 is etched without formation of the resist mask 401 in the fourth photolithography step described in FIG. 4D, so that the part of the low-resistance oxide semiconductor layer 106 overlapping with the conductive layer 407 is exposed. In the example illustrated in FIGS. 11A and 11B, an oxide semiconductor layer 1105 to be a channel region is used as a mask for etching the conductive layer 407, and the part of the low-resistance oxide semiconductor layer 106 overlapping with the conductive layer 407 can be exposed. Thus, formation of the pixel electrode using the oxide semiconductor layer and formation of the resist mask can be performed at one time. Therefore, shortening of the process and reduction in a material of a resist or the like can be realized, so that cost can be reduced. Note that, in FIGS. 11A and 11B, the same portions as those in FIGS. 1A and 1B are denoted by the same reference numerals and description thereof is the same as that of FIGS. 1A and 1B.

Figure 12A:
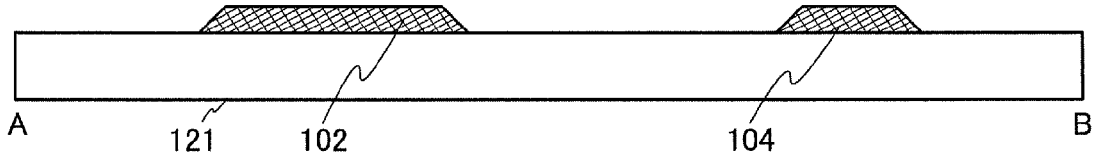
FIGS. 12A, 12B, 12C, 12D, and 12E illustrate a manufacturing process of the display device.
Figure 12B:
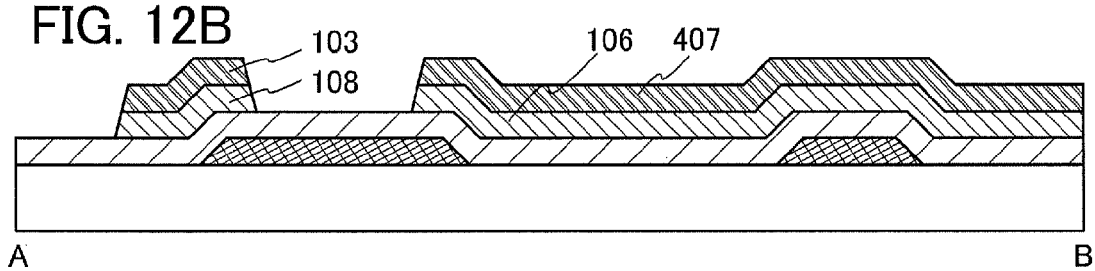
Figure 12C:
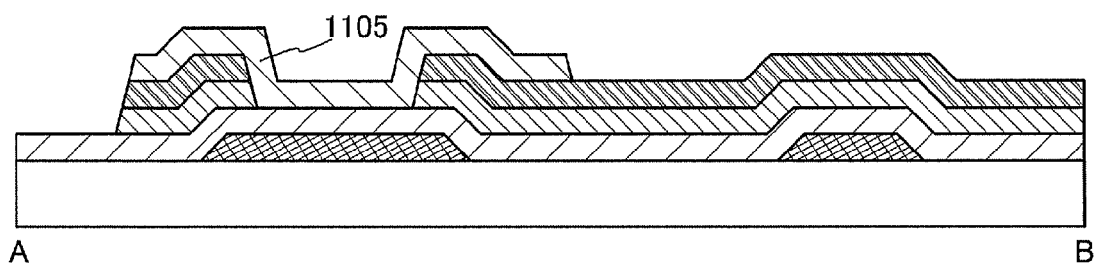
Figure 12D:
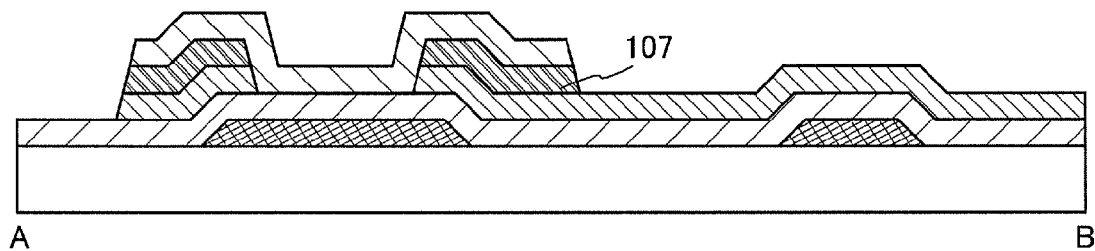
Figure 12E:
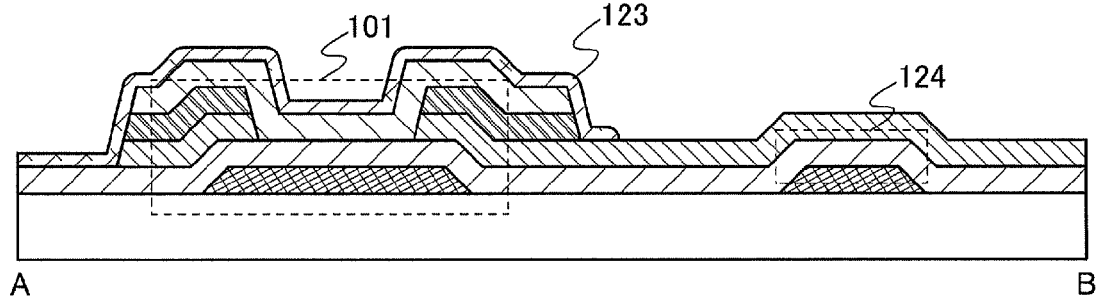

The cross-sectional view illustrated in FIG. 11B is described with reference to FIGS. 12A to 12E in a manner similar to the description of the manufacturing method illustrated in FIGS. 4A to 4E. Note that in a manufacturing method illustrated in FIGS. 12A to 12E, different points from FIGS. 4A to 4E are as follows: the high-resistance oxide semiconductor film is processed in the third photolithography step to have a shape that is similar to that of the oxide semiconductor layer 1105 illustrated in FIG. 12C; and without formation of the resist mask 401 in the fourth photolithography step, the part of the low-resistance oxide semiconductor layer 106 overlapping with the conductive layer 407 is exposed in such a manner that the unnecessary portion of the conductive layer 407 is etched using the oxide semiconductor layer 1105 as a mask as illustrated in FIG. 12D. Thus, formation of the pixel electrode using the oxide semiconductor layer and formation of the resist mask can be performed at one time. Therefore, shortening of the process and reduction in materials of a resist and the like can be realized, so that cost can be reduced.

As described above, the structure described in this embodiment is employed, whereby the TFT 101 and the oxide semiconductor layer 106 which functions as the pixel electrode and is formed from the low-resistance oxide semiconductor can be connected to each other not through a contact hole or the like but directly. Direct connection enables a favorable contact and reduction of the number of steps such as a step for opening a contact hole, so that productivity can be improved. In addition, contact resistance between the electrode 107 and the oxide semiconductor layer 106 which functions as the pixel electrode of the TFT 101 and is formed from the low-resistance oxide semiconductor can be reduced. Further, the number of contact holes can be reduced, so that an area occupied can be reduced. Therefore, when a pixel provided with a thin film transistor using an oxide semiconductor is manufactured, productivity can be improved. Accordingly, a display device with high electric characteristics can be provided at low cost.

This embodiment can be combined with any of the structures disclosed in the other embodiments as appropriate.

Embodiment 2

An example in which a pixel of a display device is formed using a thin film transistor different from that of the above embodiment is described below.

Figure 13A:
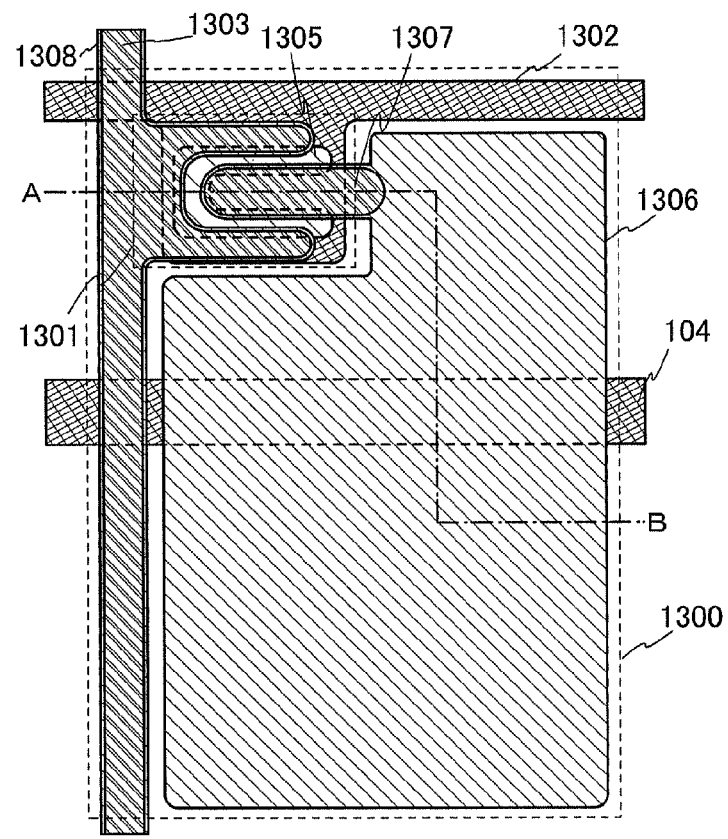
FIGS. 13A and 13B illustrate a manufacturing process of a display device.

A top view of a pixel is illustrated in FIG. 13A. Note that a TFT illustrated in FIG. 13A has a bottom-gate structure and also a so-called staggered structure (also referred to as a top-contact structure) in which wiring layers to be a source electrode and a drain electrode of the TFT are provided over an oxide semiconductor layer to be a channel region. In a pixel 1300 illustrated in FIG. 13A, the following is provided: a wiring 1302 (also referred to as a gate wiring or a first wiring) connected to a gate of the TFT 1301; a wiring 1303 (also referred to as a source wiring) connected to an electrode (also referred to as a first terminal, a second wiring, or a source electrode) of the TFT 1301; a wiring 1304 (also referred to as a capacitor wiring or a third wiring) which is provided for the same layer as the wiring 1302 to keep a voltage to be applied to a liquid crystal element that is a display element; an oxide semiconductor layer 1305 formed in an island shape; an oxide semiconductor layer 1306 functioning as a pixel electrode; and an electrode 1307 (also referred to as a second terminal or a drain electrode) which overlaps with the oxide semiconductor layer 1306 and provided for the same layer as the wiring 1303. Further, the wiring 1303 overlaps with a wiring of an oxide semiconductor layer 1308 provided for the same layer as the oxide semiconductor layer 1306.

Figure 13B:
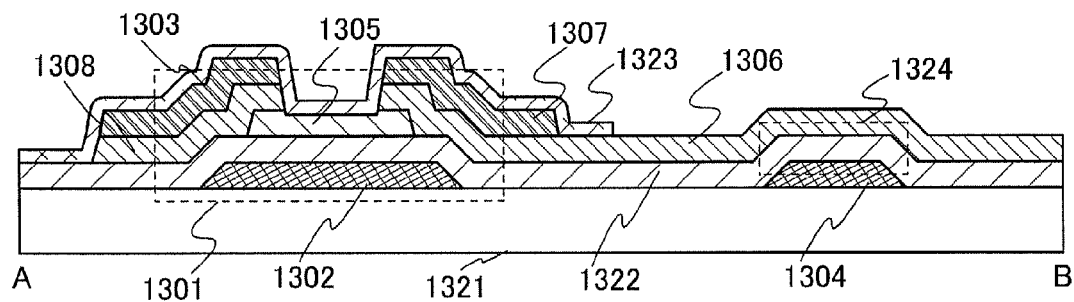

In addition, FIG. 13B illustrates a cross-sectional structure taken along chain line A-B of FIG. 13A. In the cross-sectional structure illustrated in FIG. 13B, the wiring 1302 that is the gate wiring and the wiring 1304 that is the capacitor wiring are provided over a substrate 1321. A gate insulating film 1322 is provided to cover the wiring 1302 and the wiring 1304. Over the gate insulating film 1322, the oxide semiconductor layer 1305 is provided, and the oxide semiconductor layer 1306 and the oxide semiconductor layer 1308 are provided to cover part of the oxide semiconductor layer 1305. Over the oxide semiconductor layer 1306, the electrode 1307 is provided in a region to be connected to the TFT 1301. The wiring 1303 is provided over the oxide semiconductor layer 1308. An insulating layer 1323 functioning as a passivation film is provided to cover the TFT 1301. The oxide semiconductor layer 1306, the wiring 1304, and the gate insulating film 1322 serving as a dielectric form a storage capacitor 1324.

Note that the pixel illustrated in FIGS. 13A and 13B differs from the pixel illustrated in FIGS. 1A and 1B of the above embodiment in its deposition order of layers. Thus, in this embodiment, a manufacturing process of the pixel is described in detail in a manner similar to FIGS. 4A to 4E of Embodiment 1, and a material and the like of the wirings are described quoting the description of Embodiment 1.

Next, based on the top view and the cross-sectional view illustrated in FIGS. 13A and 13B, a method of manufacturing the pixel is described with reference to FIGS. 14A to 14E.

Figure 14A:
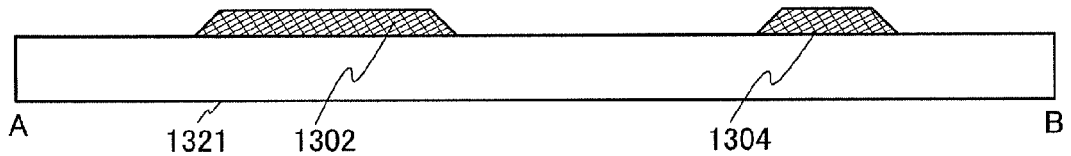
FIGS. 14A, 14B, 14C, 14D, and 14E illustrate a manufacturing process of the display device.

A conductive layer is formed over the entire surface of the substrate 1321. After that, a first photolithography step is performed to form a resist mask. Then, unnecessary portions of the conductive layer are etched, so that the first wiring and the like (the wiring 1302 to be a gate electrode, and the wiring 1304 to be the capacitor wiring) are formed. A cross-sectional view at this stage is illustrated in FIG. 14A.

Next, an insulating film (the gate insulating film 1322) is formed over the entire surfaces of the wiring 1302 and the wiring 1304.

Figure 14B:
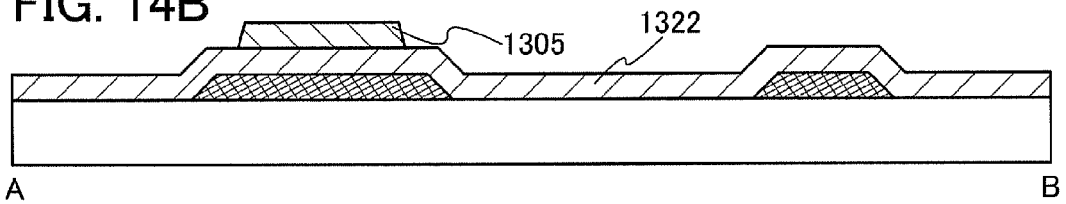

Next, a high-resistance oxide semiconductor film (a first oxide semiconductor film in this embodiment) is formed over the gate insulating film 1322. Then, a second photolithography step is performed to form a resist mask and then, the high-resistance oxide semiconductor film is etched. By wet etching or dry etching, unnecessary portions are removed, so that the oxide semiconductor layer 1305 is formed. A cross-sectional view at this stage is illustrated in FIG. 14B.

Next, a low-resistance oxide semiconductor film (also referred to as a second oxide semiconductor film or an n layer in this embodiment) is formed over surfaces of the oxide semiconductor layer 1305 and the gate insulating film 1322. Then, a conductive film is formed from a metal material over the low-resistance oxide semiconductor film.

Figure 14C:
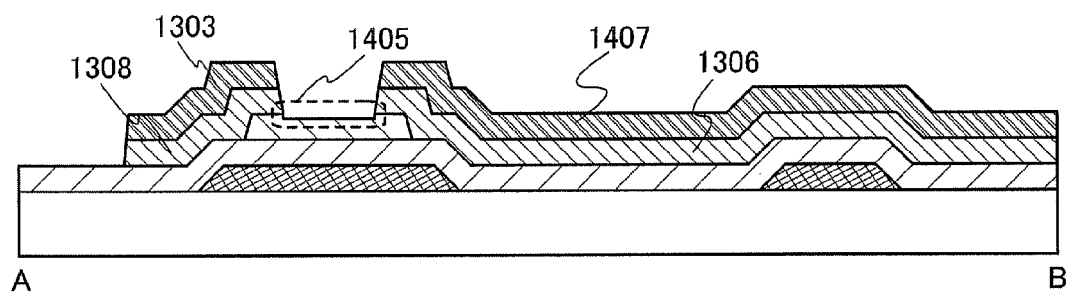

Next, a third photolithography step is performed to form a resist mask. Then, unnecessary portions are etched, so that the oxide semiconductor layer 1306 and the oxide semiconductor layer 1308 which are formed from the low-resistance oxide semiconductor film, and the wiring 1303 and a conductive layer 1407 which are formed from the conductive film are formed. Note that, a layer in which the oxide semiconductor layer 1308 formed from the low-resistance oxide semiconductor film and the wiring 1303 formed from the conductive film are stacked is referred to as a second wiring, and a layer in which the oxide semiconductor layer 1306 and the conductive layer 1407 are stacked is referred to as an electrode layer. By this etching, part (a portion 1405 denoted by a dotted line in FIG. 14C) of the oxide semiconductor layer 1305 is etched. Therefore, the oxide semiconductor layer 1305 is preferably formed to be thick. A cross-sectional view at this stage is illustrated in FIG. 14C.

Figure 14D:
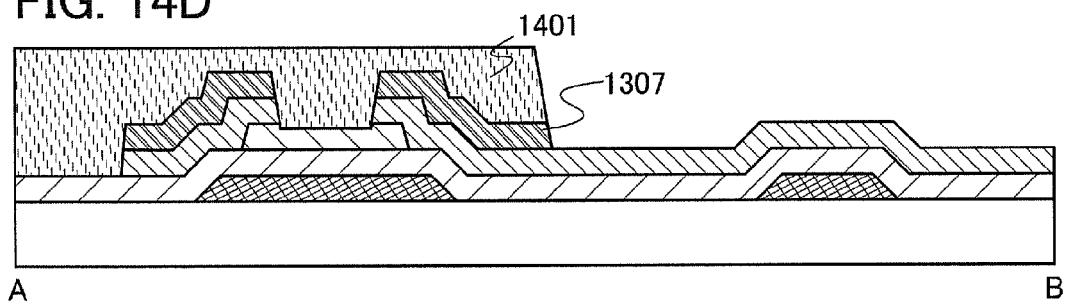

Next, a fourth photolithography step is performed to form a resist mask 1401, and unnecessary portions of the conductive layer 1407 serving as the electrode layer, that is, a region functioning as the pixel electrode of the electrode layer is etched. Then, part of the low-resistance oxide semiconductor layer 1306 overlapping with the conductive layer 1407 is exposed, so that an electrode 1307 is formed. The exposed part of the low-resistance oxide semiconductor layer 1306 can function as the pixel electrode of the pixel 1300. A cross-sectional view at this stage is illustrated in FIG. 14D.

Note that when the oxide semiconductor layer 1308 and the oxide semiconductor layer 1306 are provided, a junction between the wiring 1303 and the electrode 1307 which are conductive layers and the oxide semiconductor layer 1305 is favorable and achieves higher operation stability also in terms of heat than Schottky junction. In addition, it is effective to positively provide the low-resistance oxide semiconductor layer in the TFT 1301 in order that resistance component is not formed at an interface with the first terminal to be the source supplying carriers of the channel or the second terminal to be the drain absorbing the carriers of the channel. Further, with the low-resistance oxide semiconductor layer, the TFT can have favorable mobility even when a drain voltage is high.

Figure 14E:
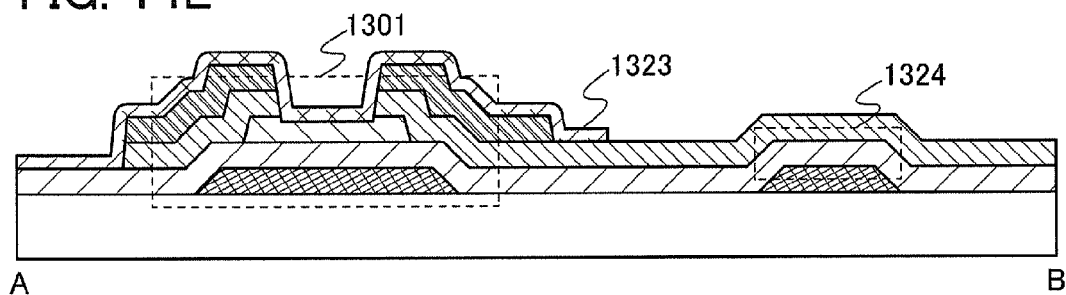

Next, the resist mask 1401 is removed and an insulating layer is formed. Then, a fifth photolithography step is performed to form a resist mask, and the insulating layer is etched to form the insulating layer 1323 covering the TFT 1301. The gate insulating film 1322 serving as a dielectric, the wiring 1304, and the oxide semiconductor layer 1306 form the storage capacitor 1324 in a region overlapping with the wiring 1304. A cross-sectional view at this stage is illustrated in FIG. 14E.

In this manner, the pixel provided with the bottom-gate top-contact n-channel TFT 1301 can be formed. These are arranged in matrix in respective pixels so that a pixel portion is formed, which can be used as one of boards for manufacturing an active matrix display device.

Figure 15A:
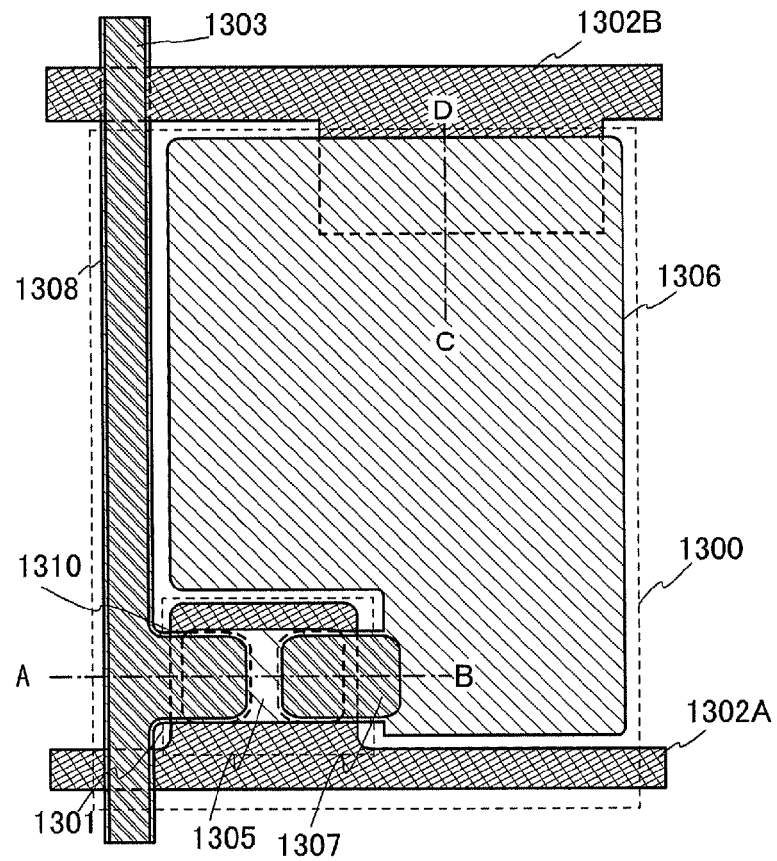
FIGS. 15A and 15B illustrate a manufacturing process of a display device.
Figure 15B:
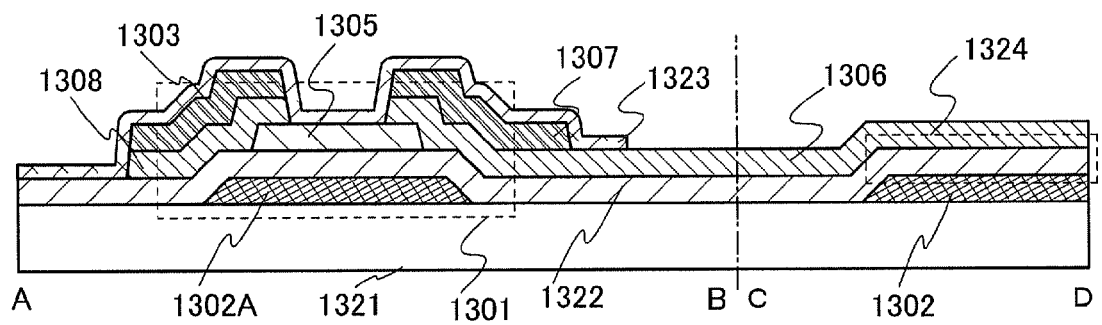

This embodiment is not limited to the pixel illustrated in FIGS. 13A and 13B. Alternatively, another structure may be employed. As an example, a top view and a cross-sectional view which are different from FIGS. 13A and 13B are illustrated in FIGS. 15A and 15B. Note that FIG. 15B illustrates a cross-sectional structure taken along chain lines A-B and C-D of FIG. 15A. FIGS. 15A and 15B illustrate an example in which the oxide semiconductor layer 1306 functioning as the pixel electrode and a wiring functioning as a gate line of an adjacent pixel overlap with each other with the gate insulating film 1322 interposed between the oxide semiconductor layer 1306 and the wiring functioning as the gate line of the adjacent pixel, so that the storage capacitor 1324 is formed without a capacitor wiring. In this case, the wiring 1304 functioning as the capacitor wiring illustrated in FIGS. 13A and 13B can be omitted. Note that, in FIGS. 15A and 15B, the same portions as those in FIGS. 13A and 13B are denoted by the same reference numerals and description thereof is the same as that of FIGS. 13A and 13B. In FIGS. 15A and 15B, a wiring 1302A functioning as a gate line and a wiring 1302B functioning as a gate line of a pixel which is prior to a pixel including the wiring 1302A form a storage capacitor. Therefore, since a capacitor wiring does not need to be provided, an aperture ratio can be improved.

As described above, the structure described in this embodiment is employed, whereby the TFT 1301 and the oxide semiconductor layer 1306 which functions as the pixel electrode and is formed from the low-resistance oxide semiconductor can be connected to each other not through a contact hole or the like but directly. Direct connection enables a favorable contact and reduction of the number of steps such as a step for opening a contact hole, so that productivity can be improved. In addition, contact resistance between the electrode 1307 and the oxide semiconductor layer 1306 which functions as the pixel electrode of the TFT 1301 and is formed from a low-resistance oxide semiconductor can be reduced. Further, the number of contact holes can be reduced, so that an area occupied can be reduced. Therefore, when a pixel provided with a thin film transistor using an oxide semiconductor is manufactured, productivity can be improved. Accordingly, a display device with high electric characteristics can be provided at low cost.

This embodiment can be combined with any of the structures disclosed in the other embodiments, as appropriate.

Embodiment 3

An example in which a pixel of a display device is formed using a thin film transistor different from those of the above embodiments is described below.

Figure 16A:
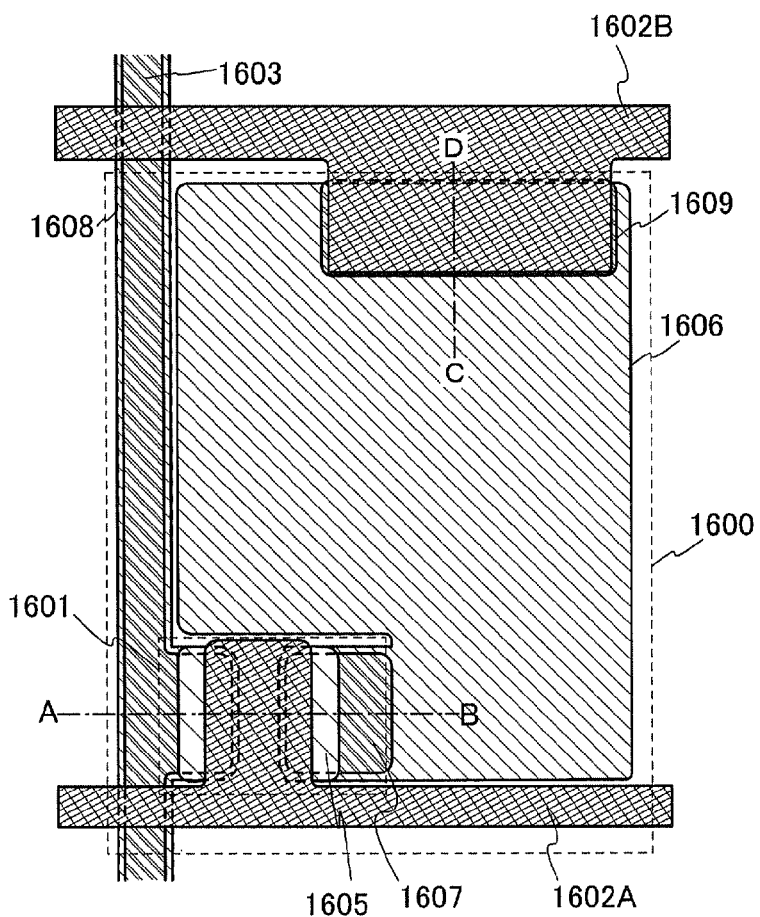
FIGS. 16A and 16B illustrate a manufacturing process of a display device.

A top view of a pixel is illustrated in FIG. 16A. Note that a TFT illustrated in FIG. 16A has a top-gate structure and also a so-called staggered structure (also referred to as a bottom-contact structure) in which wiring layers to be a source electrode and a drain electrode of the TFT are provided below an oxide semiconductor layer to be a channel region. In a pixel 1600 illustrated in FIG. 16A, the following is provided: a wiring 1602A (also referred to as a gate wiring or a second wiring) connected to a gate of the TFT 1601; a wiring 1603 (also referred to as a source wiring) connected to an electrode (also referred to as a first terminal, a first wiring, or a source electrode) of the TFT 1601; a wiring 1602B (also referred to as a capacitor wiring or a third wiring) which is provided for as the same layer as the wiring 1602A to keep a voltage to be applied to a liquid crystal element that is a display element; an oxide semiconductor layer 1605 having an island shape; an oxide semiconductor layer 1606 functioning as a pixel electrode; and an electrode 1607 (also referred to as a second terminal or a drain electrode) which overlaps with the oxide semiconductor layer 1606 and provided for the same layer as the wiring 1603. Further, the wiring 1603 overlaps with a wiring of an oxide semiconductor layer 1608 provided for the same layer as the oxide semiconductor layer 1606. FIG. 16A illustrates the wiring 1602B functioning as a gate line of a pixel prior to the pixel including the wiring 1602A. Then, an electrode 1609 which overlaps with the oxide semiconductor layer 1606 and the wiring 1602B and is formed for the same layer as the wiring 1603 is provided.

Figure 16B:
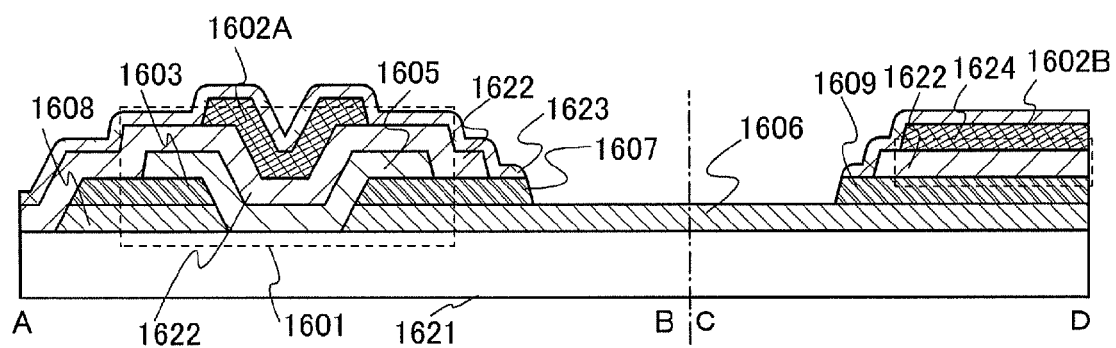

In addition, FIG. 16B illustrates a cross-sectional structure taken along chain lines A-B and C-D in FIG. 16A. In the cross-sectional structure illustrated in FIG. 16B, the oxide semiconductor layer 1608 and the oxide semiconductor layer 1606 are provided over a substrate 1621. The wiring 1603 is provided over the oxide semiconductor layer 1608. Further, in a region serving as the TFT 1601, the electrode 1607 is provided over the oxide semiconductor layer 1606, and the electrode 1609 is provided in a region overlapping with the wiring 1602B over the oxide semiconductor layer 1606. In addition, the oxide semiconductor layer 1605 is provided between the wiring 1603 and the electrode 1607 to cover part of the wiring 1603 and the electrode 1607. A gate insulating film 1622 is provided over the electrode 1609 to cover the oxide semiconductor layer 1605. Over the gate insulating film 1622, the wiring 1602A overlapping with the oxide semiconductor layer 1605, which is to be the gate wiring, and the wiring 1602B are provided. In addition, an insulating layer 1623 functioning as a passivation film is provided to cover the TFT 1601. Further, the electrode 1609, the wiring 1602B, and the gate insulating film 1622 serving as a dielectric form a storage capacitor 1624.

Note that the pixel illustrated in FIGS. 16A and 16B differs from the pixel illustrated in FIGS. 1A and 1B of the above embodiment in its deposition order of layers. Thus, in this embodiment, a manufacturing process of the pixel is described in detail in a manner similar to FIGS. 4A to 4E of Embodiment 1, and a material and the like of the wirings are described quoting the description of Embodiment 1.

Next, based on the top view and the cross-sectional view illustrated in FIGS. 16A and 16B, the method of manufacturing the pixel is described with reference to FIGS. 17A to 17E.

Figure 17A:
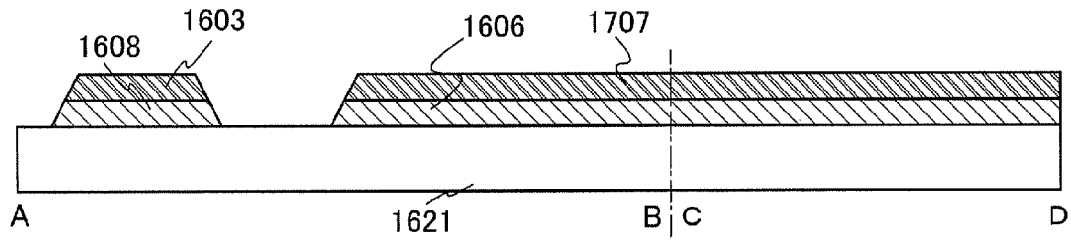
FIGS. 17A, 17B, 17C, 17D, and 17E illustrate a manufacturing process of the display device.

A low-resistance oxide semiconductor film (also referred to as a first oxide semiconductor film or an n+ layer in this embodiment) is formed over the substrate 1621. Next, a conductive film is formed from a metal material over the low-resistance oxide semiconductor film. Then, a first photolithography step is performed to form a resist mask, and unnecessary portions are etched, so that the oxide semiconductor layer 1606 and the oxide semiconductor layer 1608 which are formed from the low-resistance oxide semiconductor film, and the wiring 1603 and a conductive layer 1707 which are formed from the conductive film are formed. Note that a layer in which the oxide semiconductor layer 1608 formed from the low-resistance oxide semiconductor film and the wiring 1603 formed from the conductive film are stacked is referred to as a first wiring, and a layer in which the oxide semiconductor layer 1606 and the conductive layer 1707 are stacked is referred to as an electrode layer. A cross-sectional view at this stage is illustrated in FIG. 17A.

Figure 17B:
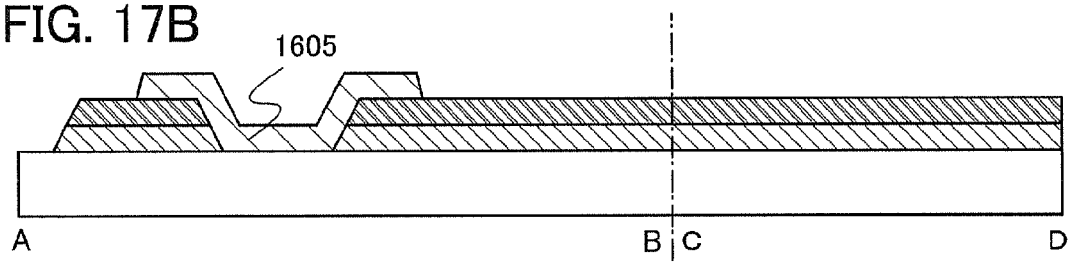

Then, a high-resistance oxide semiconductor film (in this embodiment, a second oxide semiconductor film) is formed over the substrate 1621, the wiring 1603, and the conductive layer 1707. Then, a second photolithography step is performed to form a resist mask, and unnecessary portions of the high-resistance oxide semiconductor film are etched. By wet etching or dry etching, the unnecessary portions are removed, so that the oxide semiconductor layer 1605 is formed. A cross-sectional view at this stage is illustrated in FIG. 17B.

Figure 17C:
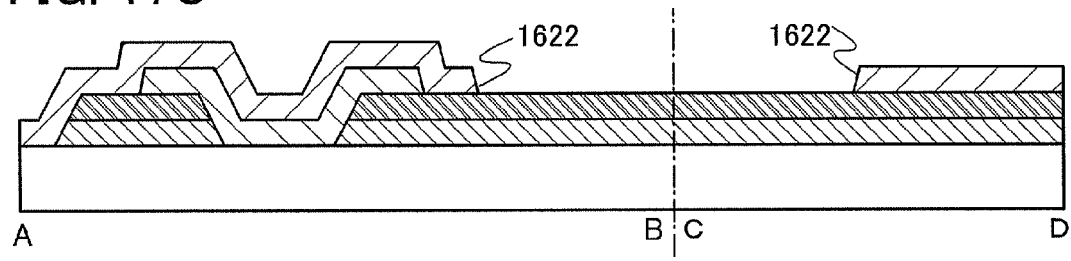

Subsequently, an insulating film is formed over the entire surfaces of the oxide semiconductor layer 1605, the wiring 1603, and the conductive layer 1707. A third photolithography step is performed to form a resist mask. Then, unnecessary portions of the insulating film are etched, so that the gate insulating film 1622 is formed. Note that the gate insulating film 1622 is formed in such a manner that the insulating film remains in a region in which the storage capacitor is formed. A cross-sectional view at this stage is illustrated in FIG. 17C.

Next, after a conductive layer is formed over the gate insulating film 1622 and the conductive layer 1707, a fourth photolithography step is performed to form a resist mask.

Figure 17D:
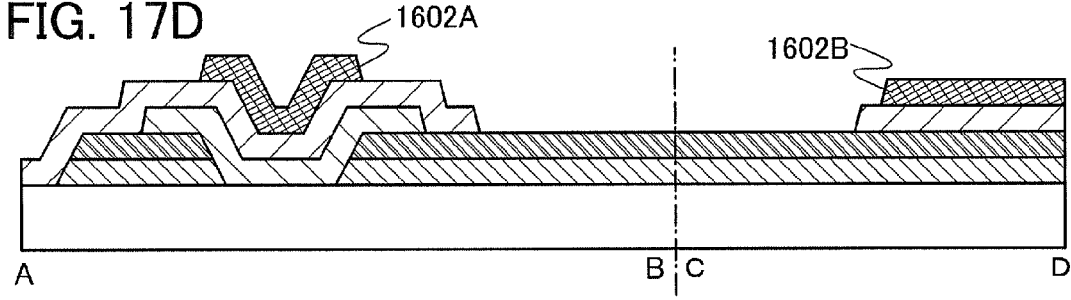

Then, the conductive layer is etched and unnecessary portions are removed, so that the second wiring and the like (the wiring 1602A which is to be the gate electrode and the wiring 1602B) are formed. A cross-sectional view at this stage is illustrated in FIG. 17D.

Figure 17E:
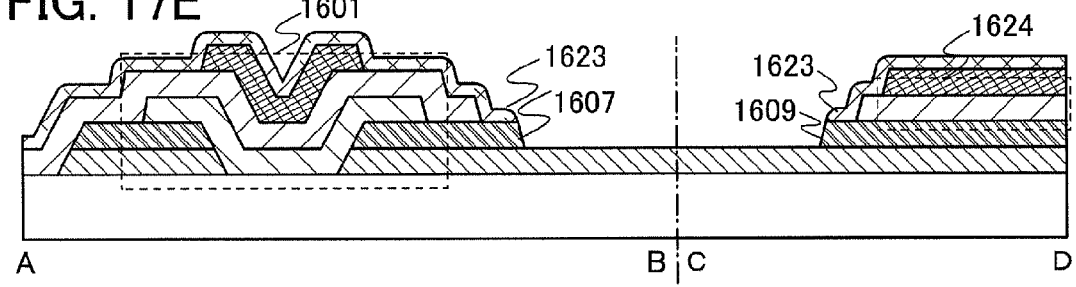

Next, an insulating layer is formed over the wiring 1602A, the wiring 1602B, the gate insulating film 1622, and the conductive layer 1707. Then, a fifth photolithography step is performed to form a resist mask, and the insulating layer is etched to form the insulating layer 1623 covering the TFT 1601 and the storage capacitor 1624. Next, unnecessary portions of the conductive layer 1707 serving as the electrode layer, that is, a region functioning as a pixel electrode of the electrode layer is etched using the insulating layer 1623 as a mask. Then, part of the low-resistance oxide semiconductor layer 1606 overlapping with the conductive layer 1707 is exposed, so that the electrode 1607 and the electrode 1609 are formed. The exposed low-resistance oxide semiconductor layer 1606 can function as the pixel electrode of the pixel 1600. A cross-sectional view at this stage is illustrated in FIG. 17E.

Note that when the oxide semiconductor layer 1608 and the oxide semiconductor layer 1606 are provided, a junction between the wiring 1603 and the electrode 1607 which are conductive layers and the oxide semiconductor layer 1605 is favorable and achieves higher operation stability also in terms of heat than Schottky junction. In addition, it is effective to positively provide the low-resistance oxide semiconductor layer in the TFT 1601 in order that a resistance component is not formed at an interface with the first terminal to be the source supplying carriers of the channel or the second terminal to be the drain absorbing the carriers of the channel. Further, with the low-resistance oxide semiconductor layer, the TFT can have favorable mobility even when a drain voltage is high.

In this manner, the pixel including the top-gate bottom-contact n-channel TFT 1601 can be manufactured. When these are arranged in a matrix corresponding to respective pixels, a pixel portion can be formed and one of the substrates for manufacturing an active matrix display device can be obtained.

As described above, the structure described in this embodiment is employed, whereby the TFT 1601 and the oxide semiconductor layer 1606 which functions as the pixel electrode and is formed from the low-resistance oxide semiconductor can be connected to each other not through a contact hole or the like but directly. Direct connection enables a favorable contact and reduction of the number of steps such as a step for opening a contact hole, so that productivity can be improved. In addition, contact resistance between the electrode 1607 and the oxide semiconductor layer 1606 which functions as the pixel electrode of the TFT 1601 and is formed from a low-resistance oxide semiconductor can be reduced. Further, the number of contact holes can be reduced, so that an area occupied can be reduced. Therefore, when a pixel provided with a thin film transistor using an oxide semiconductor is manufactured, productivity can be improved. Accordingly, a display device with high electric characteristics can be provided at low cost.

This embodiment can be combined with any of the structures disclosed in the other embodiments, as appropriate.

Embodiment 4

An example in which a pixel of a display device is formed using a thin film transistor different from those of the above embodiments is described below.

Figure 18A:
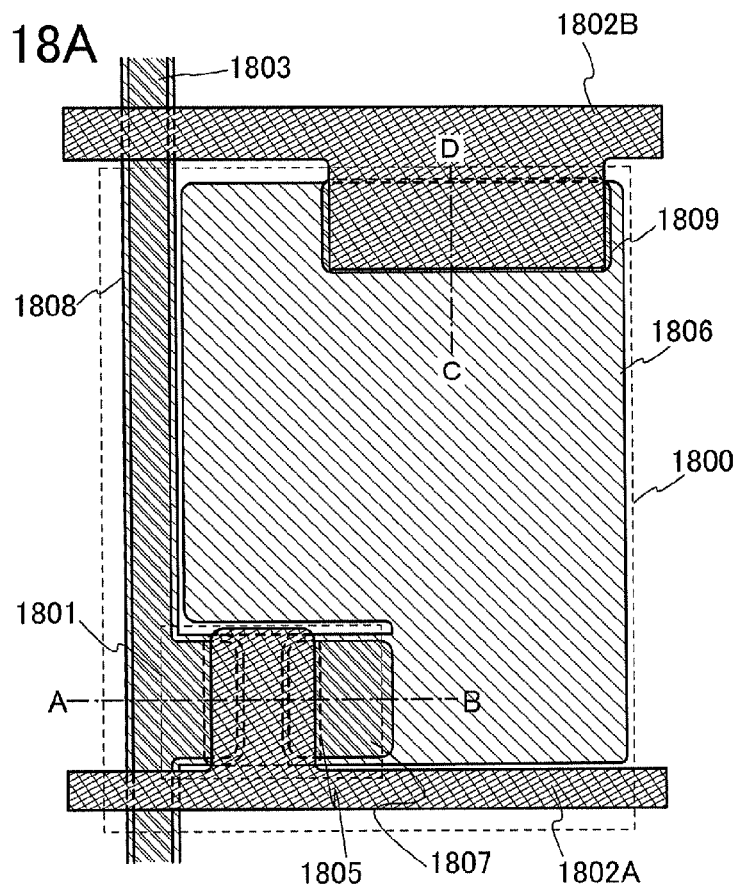
FIGS. 18A and 18B illustrate a manufacturing process of a display device.

A top view of a pixel is illustrated in FIG. 18A. Note that a TFT illustrated in FIG. 18A has a top-gate structure and also a so-called coplanar structure (also referred to as a top-contact structure) in which wiring layers to be a source electrode and a drain electrode of the TFT are provided over an oxide semiconductor layer to be a channel region. In a pixel 1800 illustrated in FIG. 18A, the following is provided: a wiring 1802A (also referred to as a gate wiring or a second wiring) connected to a gate of a TFT 1801; a wiring 1803 (also referred to as a source wiring) connected to an electrode (also referred to as a first terminal, a first wiring, or a source electrode) of the TFT 1801; a wiring 1802B (also referred to as a capacitor wiring or a third wiring) which is provided for the same layer as the wiring 1802A to keep a voltage to be applied to a liquid crystal element that is a display element; an oxide semiconductor layer 1805 formed in an island shape; an oxide semiconductor layer 1806 functioning as a pixel electrode; and an electrode 1807 (also referred to as a second terminal or a drain electrode) which overlaps with the oxide semiconductor layer 1806 and provided for the same layer as the wiring 1803. Further, the wiring 1803 overlaps with a wiring of an oxide semiconductor layer 1808 provided for the same layer as the oxide semiconductor layer 1806. In FIG. 18A, the wiring 1802B functioning as a gate line of a pixel prior to the pixel including the wiring 1802A is illustrated. Then, an electrode 1809 which overlaps with the oxide semiconductor layer 1806 and the wiring 1802B and is formed for the same layer as the wiring 1803 is provided.

Figure 18B:
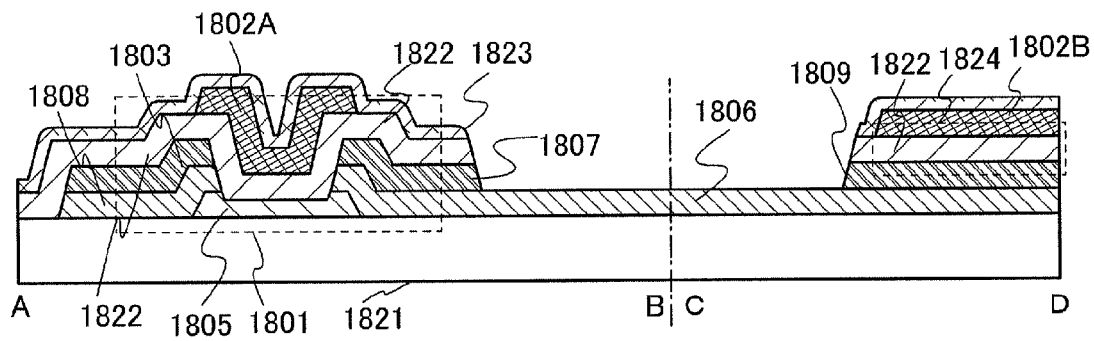

In addition, FIG. 18B illustrates a cross-sectional structure taken along chain lines A-B and C-D in FIG. 18A. In the cross-sectional structure illustrated in FIG. 18B, the oxide semiconductor layer 1805 is provided over a substrate 1821. In addition, the oxide semiconductor layer 1808 and the oxide semiconductor layer 1806 are provided to cover part of the oxide semiconductor layer 1805. The wiring 1803 is provided over the oxide semiconductor layer 1808. Further, in a region serving as the TFT 1801, the electrode 1807 is provided over the oxide semiconductor layer 1806, and the electrode 1809 is provided in a region overlapping with the wiring 1802B over the oxide semiconductor layer 1806. A gate insulating film 1822 is provided over the electrode 1809, the wiring 1803, the electrode 1807, and the oxide semiconductor layer 1805. Over the gate insulating film 1822, the wiring 1802A overlapping with the oxide semiconductor layer 1605, which is to be the gate wiring, and the wiring 1802B are provided. In addition, an insulating layer 1823 functioning as a passivation film is provided to cover the TFT 1801. Further, the electrode 1809, the wiring 1802B, and the gate insulating film 1822 serving as a dielectric form a storage capacitor 1824.

Note that the pixel illustrated in FIGS. 18A and 18B differs from the pixel illustrated in FIGS. 1A and 1B of the above embodiment in its deposition order of layers. Thus, in this embodiment, a manufacturing process of the pixel is described in detail in a manner similar to FIGS. 4A to 4E of Embodiment 1, and a material and the like of the wirings are described quoting the description of Embodiment 1.

Next, based on the top view and the cross-sectional view illustrated in FIGS. 18A and 18B, the method of manufacturing the pixel is described with reference to FIGS. 19A to 19E.

Figure 19A:
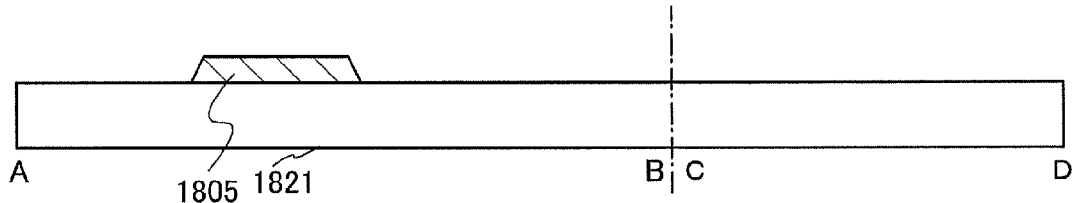
FIGS. 19A, 19B, 19C, 19D, and 19E illustrate a manufacturing process of the display device.

A high-resistance oxide semiconductor film (a first oxide semiconductor layer in this embodiment) is formed over the substrate 1821. Then, a first photolithography step is performed to form a resist mask, and unnecessary portions of the high-resistance oxide semiconductor layer are etched. By wet etching or dry etching, the unnecessary portions are removed, so that the oxide semiconductor layer 1805 is formed. A cross-sectional view at this stage is illustrated in FIG. 19A.

Figure 19B:
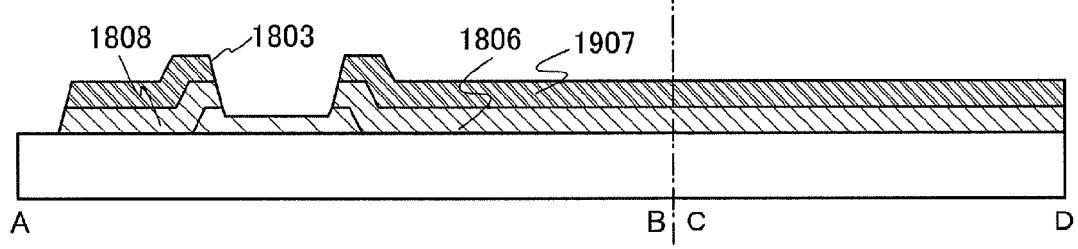

Next, a low-resistance oxide semiconductor film (also referred to as a second oxide semiconductor film or an n+ layer in this embodiment) is formed. Then, a conductive film is formed from a metal material over the low-resistance oxide semiconductor film. Subsequently, a second photolithography step is performed to form a resist mask, and unnecessary portions are etched, so that the oxide semiconductor layer 1806 and the oxide semiconductor layer 1808 which are formed from the low-resistance oxide semiconductor film, and the wiring 1803 and a conductive layer 1907 which are formed from the conductive film are formed. Note that a layer in which the oxide semiconductor layer 1808 formed from the low-resistance oxide semiconductor film and the wiring 1803 formed from the conductive film are stacked is referred to as a first wiring, and a layer in which the oxide semiconductor layer 1806 and the conductive layer 1907 are stacked is referred to as an electrode layer. By the etching at this time, part of the oxide semiconductor layer 1805 is etched. Therefore, the oxide semiconductor layer 1805 is preferably formed to be thick. A cross-sectional view at this stage is illustrated in FIG. 19B.

Figure 19C:
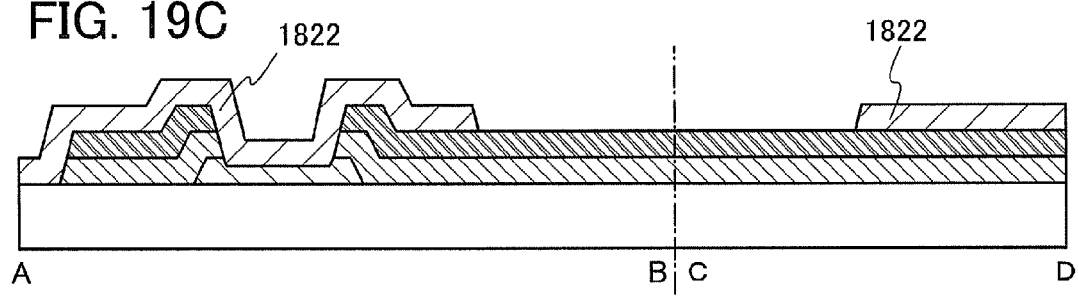

Then, an insulating film is formed over the substrate 1821, the oxide semiconductor layer 1805, the wiring 1803, and the conductive layer 1907. A third photolithography step is performed to form a resist mask, and unnecessary portions of the insulating film are etched to form the gate insulating film 1822. Note that the gate insulating film 1822 is formed in such a manner that the insulating film remains in a region in which the storage capacitor is formed. A cross-sectional view at this stage is illustrated in FIG. 19C.

Figure 19D:
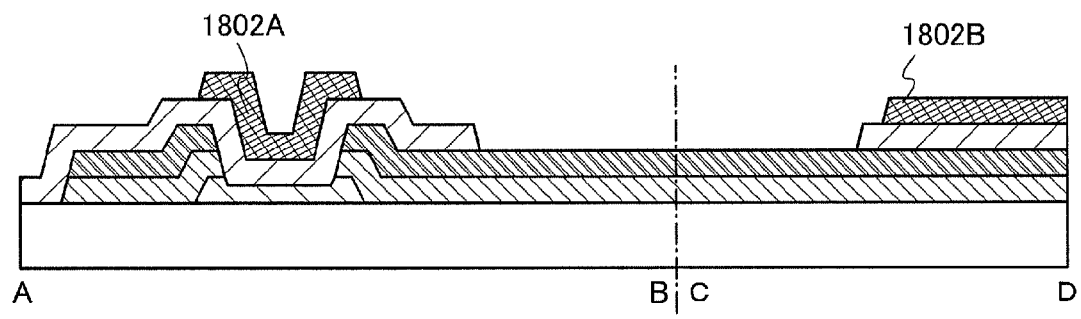

Next, after the conductive layer is formed over the gate insulating film 1822 and the conductive layer 1907, a fourth photolithography step is performed to form a resist mask. Then, the conductive layer is etched and unnecessary portions are removed, so that the second wiring and the like (the wiring 1802A which is to be the gate electrode and the wiring 1802B) are formed. A cross-sectional view at this stage is illustrated in FIG. 19D.

Figure 19E:
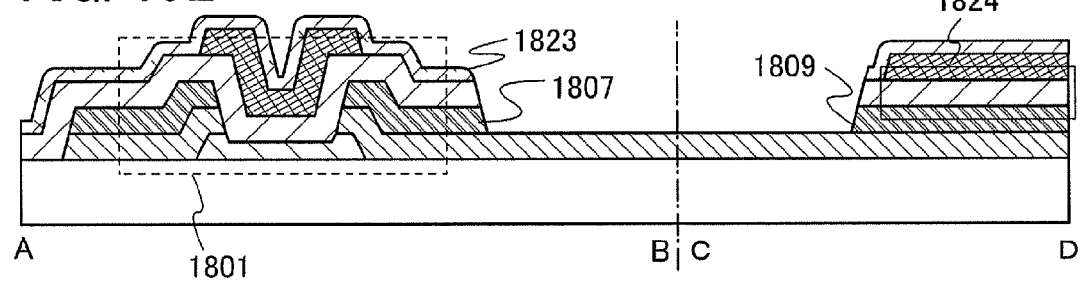

Next, an insulating layer is formed over the wiring 1802A, the wiring 1802B, the gate insulating film 1822, and the conductive layer 1907. Then, a fifth photolithography step is performed to form a resist mask, and the insulating layer is etched to form the insulating layer 1823 covering the TFT 1801 and the storage capacitor 1824. Next, unnecessary portions of the conductive layer 1907 serving as the electrode layer, that is, a region functioning as a pixel electrode of the electrode layer is etched using the insulating layer 1823 as a mask. Then, part of the low-resistance oxide semiconductor layer 1806 overlapping with the conductive layer 1907 is exposed, so that the electrode 1807 and the electrode 1809 are formed. The exposed low-resistance oxide semiconductor layer 1806 can function as the pixel electrode of the pixel 1800. A cross-sectional view at this stage is illustrated in FIG. 19E.

Note that when the oxide semiconductor layer 1808 and the oxide semiconductor layer 1806 are provided, a junction between the wiring 1803 and the electrode 1807 which are conductive layers and the oxide semiconductor layer 1805 is favorable and achieves higher operation stability also in terms of heat than Schottky junction. In addition, it is effective to positively provide the low-resistance oxide semiconductor layer in the TFT 1801 in order that a resistance component is not formed at an interface with the first terminal to be the source supplying carriers of the channel or the second terminal to be the drain absorbing the carriers of the channel. Moreover, since resistance is reduced, good mobility can be ensured even with a high drain voltage.

In this manner, the pixel including the top-gate top-contact n-channel TFT 1801 can be manufactured. When these pixel thin film transistor portion and storage capacitor are arranged in a matrix corresponding to respective pixels, a pixel portion can be formed and one of the substrates for manufacturing an active matrix display device can be obtained.

As described above, the structure described in this embodiment is employed, whereby the TFT 1801 and the oxide semiconductor layer 1806 which functions as the pixel electrode and is formed from a low-resistance oxide semiconductor can be connected to each other not through a contact hole or the like but directly. Direct connection enables a favorable contact and reduction of a step such as a step for opening a contact hole, so that productivity can be improved. In addition, contact resistance between the electrode 1807 and the oxide semiconductor layer 1806 which functions as the pixel electrode of the TFT 1801 and is formed from a low-resistance oxide semiconductor can be reduced. Further, the number of contact holes can be reduced, so that an area occupied can be reduced. Therefore, when a pixel provided with a thin film transistor using an oxide semiconductor is manufactured, productivity can be improved. Accordingly, a display device with high electric characteristics can be provided at low cost.

This embodiment can be combined with any of the structures disclosed in the other embodiments, as appropriate.

Embodiment 5

In this embodiment, an example is described in which the display device described in FIGS. 10A and 10B of Embodiment 1 is applied to a light-emitting display device. Light-emitting elements utilizing electroluminescence are classified according to the type of a light-emitting material, that is, an organic compound or an inorganic compound. In general, the former is referred to as an organic EL element, the latter as an inorganic EL element.

In an organic EL element, voltage is applied to the light-emitting element, so that electrons are injected from an electrode into a layer including a light-emitting organic compound, and holes are injected from the other electrode into the layer including the light-emitting organic compound, and there flows electric current. Then, by recombination of these carriers (electrons and holes), the organic compound having a light-emitting property gets in an excited state, and light is emitted when the excited state returns to a ground state. From such a mechanism, such a light-emitting element is referred to as a current-excitation-type light-emitting element.

Inorganic EL elements are classified according to their element structures into a dispersive inorganic EL element and a thin-film inorganic EL element. A dispersive inorganic EL element includes a light-emitting layer in which particles of a light-emitting material are dispersed in a binder, and light emission mechanism thereof is donor-acceptor recombination light emission, in which a donor level and an acceptor level are utilized. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that the description is made here using an organic EL element as a light-emitting element.

Figure 20A:
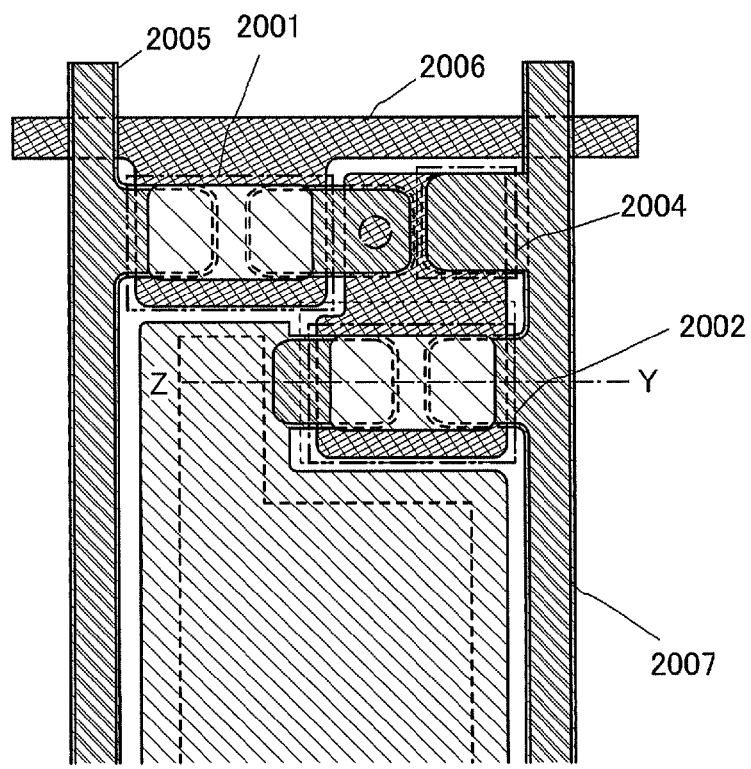
FIGS. 20A and 20B illustrate a manufacturing process of a display device.
Figure 20B:
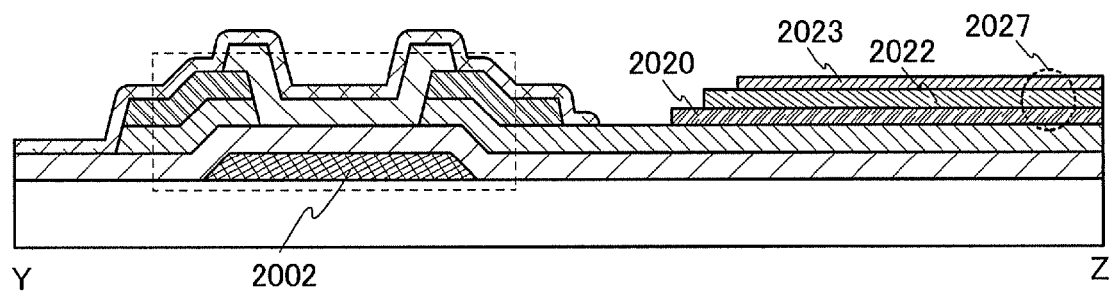
Figure 21:
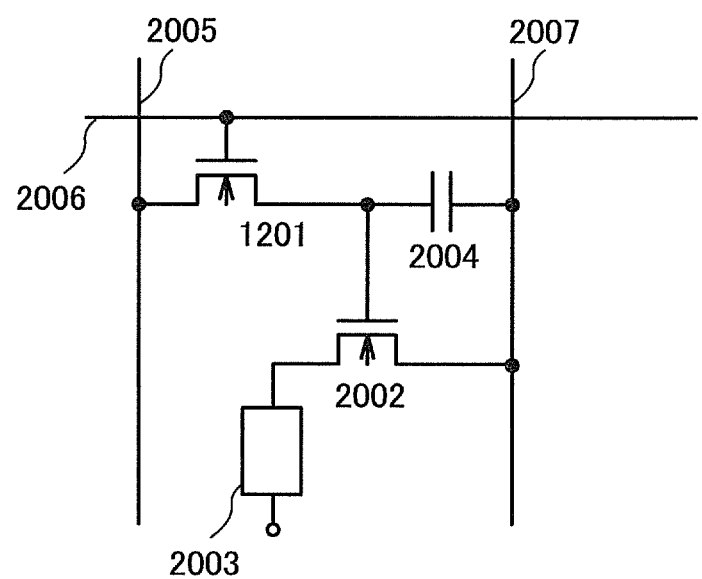
FIG. 21 illustrates a manufacturing process of the display device.

FIGS. 20A and 20B illustrate an active matrix light-emitting display device. FIG. 20A is a plan view of the light-emitting display device, and FIG. 20B is a cross-sectional view taken along line Y-Z of FIG. 20A. FIG. 21 illustrates an equivalent circuit of the light-emitting display device illustrated in FIGS. 20A and 20B.

TFTs 2001 and 2002, which can be manufactured in a manner similar to the TFT illustrated in FIGS. 10A and 10B of Embodiment 1, are highly reliable thin film transistors each including an oxide semiconductor layer formed from an In—Ga—Zn—O-based non-single-crystal film. Note that the TFTs 2001 and 2002 can be manufactured in similar manner to any of the TFTs illustrated in Embodiments 1 to 4.

The light-emitting display device illustrated in FIG. 20A and FIG. 21 of this embodiment includes the TFT 2001, the TFT 2002, a light-emitting element 2003, a capacitor 2004, a source wiring layer 2005, a gate wiring layer 2006, and a power supply line 2007. The TFTs 2001 and 2002 are n-channel TFTs. Note that the source wiring layer 2005, the gate wiring layer 2006, the power supply line 2007, and an electrode of each TFT each have a structure in which a conductive layer and an oxide semiconductor layer overlap with each other in a manner similar to the wiring and the electrode described in the above embodiment.

In addition, in FIG. 20B, the light-emitting display device of this embodiment includes the TFT 2002, and a first electrode layer 2020, an electroluminescent layer 2022, and a second electrode layer 2023 used for a light-emitting element 2027. Note that a partition may be formed over the TFT 2002 and the light-emitting element 2027 may be formed to cover part of the partition.

Since the TFT 2002 in the pixel is an n-channel transistor in this embodiment, a cathode is preferably used as the first electrode layer 2020 connected to a pixel electrode layer. Specifically, as the cathode, a known material with low work function, such as Ca, Al, CaF, MgAg, or AlLi, can be used. Alternatively, the pixel electrode layer may be used as the first electrode layer.

The electroluminescent layer 2022 may be formed using a single layer or a plurality of layers stacked.

The second electrode layer 2023 using an anode is formed over the electroluminescent layer 2022. The second electrode layer 2023 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added. The second electrode layer 2023 may also be formed using a titanium nitride film or a titanium film as well as the above light-transmitting conductive film. The first electrode layer 2020, the electroluminescence layer 2022, and the second electrode layer 2023 overlap with each other, whereby the light-emitting element 2027 is formed. After that, a protective film may be formed over the second electrode layer 2023 and the partition 2021 in order to prevent entry of oxygen, hydrogen, moisture, carbon dioxide, or the like into the light-emitting element 2027. As the protective film, a silicon nitride film, a silicon nitride oxide film, a DLC film, or the like can be formed.

Further, in a practical case, it is preferable that the light-emitting display device completed to the state illustrated in FIG. 20B be packaged (sealed) with a protective film (such as an attachment film or an ultraviolet curable resin film) or a cover material with high air-tightness and little degasification so that the display device is not exposed to the outside air.

This embodiment can be combined with any of the structures disclosed in the other embodiments, as appropriate.

Embodiment 6

In this embodiment, an example is described in which the display device described in FIGS. 10A and 10B of Embodiment 1 is used for electronic paper (also referred to as digital paper or a paper-like display).

Figure 22:
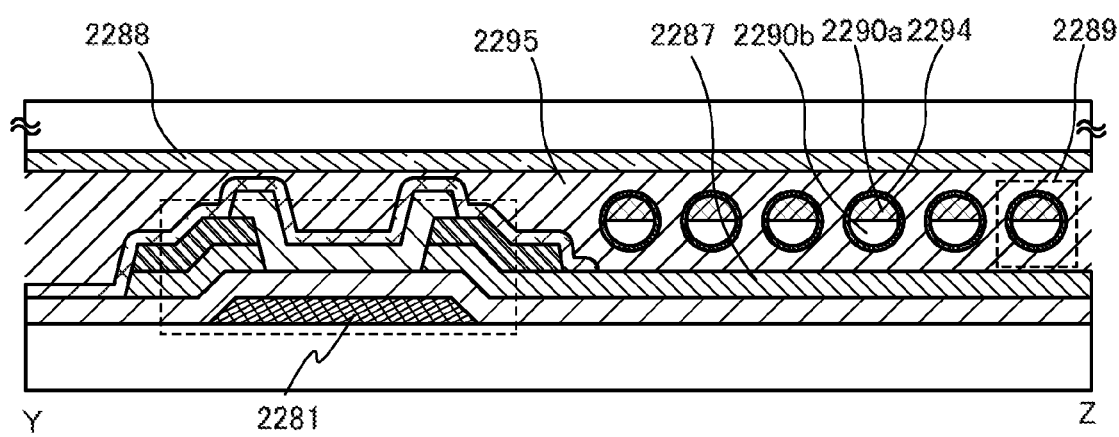
FIG. 22 illustrates a manufacturing process of a display device.

FIG. 22 illustrates a cross-sectional structure of active-matrix electronic paper. A TFT 2281, which can be manufactured in a manner similar to the TFT illustrated in FIGS. 10A and 10B of Embodiment 1, is a highly reliable TFT including an oxide semiconductor layer formed from an In—Ga—Zn—O-based non-single-crystal film. Note that the TFT 2281 can be manufactured in similar manner to any of the TFTs illustrated in Embodiments 1 to 4.

The electronic paper in FIG. 22 is an example of a display device using a twisting ball display system. The twisting ball display system refers to a method in which spherical particles each colored in black and white are arranged between a first electrode layer and a second electrode layer, and a potential difference is generated between the first electrode layer and the second electrode layer to control orientation of the spherical particles, so that display is performed.

The TFT 2281 is electrically connected to a first electrode layer 2287 and spherical particles 2289 are provided between the first electrode layer 2287 and a second electrode layer 2288. Each of the spherical particles 2289 has a black region 2290a and a white region 2290b which are surrounded by a cavity 2294 filled with liquid. A space around the spherical particles 2289 is filled with a filler 2295 such as resin (see FIG. 22).

Further, instead of the twisting ball, an electrophoretic element can also be used. Because the electrophoretic element has higher reflectance compared with a liquid crystal display element, an auxiliary light is unnecessary, less power is consumed, and a display portion can be recognized even in a dim place. In addition, even when power is not supplied to the display portion, an image which has been displayed once can be maintained. Accordingly, a displayed image can be stored even if a housing having the display portion is distanced from an electric wave source.

This embodiment can be combined with any of the structures disclosed in the other embodiments, as appropriate.

Embodiment 7

In this embodiment, examples of an electronic apparatus provided with the display device described in the above embodiment are described.

Figure 23A:
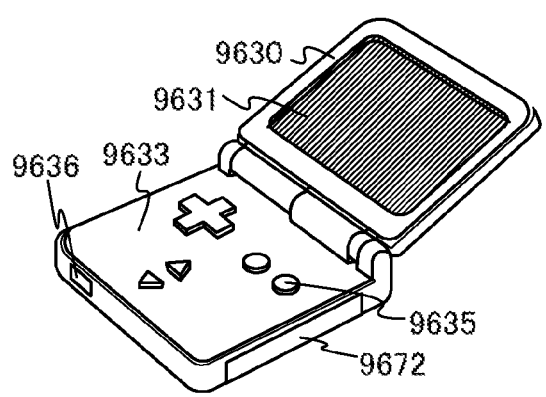
FIGS. 23A, 23B, and 23C each illustrate an electronic apparatus.

FIG. 23A illustrates a portable game machine, which can include a housing 9630, a display portion 9631, a speaker 9633, operation keys 9635, a connection terminal 9636, a recording medium insert reading portion 9672, and the like. The portable game machine illustrated in FIG. 23A can have a function of reading a program or data stored in the recording medium to display it on the display portion, a function of sharing information with another portable game machine by wireless communication, and the like. The portable game machine illustrated in FIG. 23A can have various functions without limitation to the above.

Figure 23B:
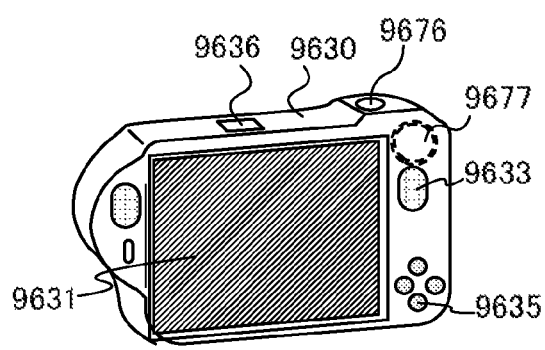

FIG. 23B illustrates a digital camera, which can include a housing 9630, a display portion 9631, a speaker 9633, operation keys 9635, a connection terminal 9636, a shutter button 9676, an imaging receiving portion 9677, and the like. The digital camera having a television reception function illustrated in FIG. 23B can have various functions such as a function of photographing a still image and a moving image; a function of automatically or manually adjusting the photographed image; a function of obtaining various kinds of information from an antenna; a function of storing the photographed image or the information obtained from the antenna; and a function of displaying the photographed image or the information obtained from the antenna on the display portion. Note that the digital camera having the television reception function illustrated in FIG. 23B can have a variety of functions without being limited to the above.

Figure 23C:
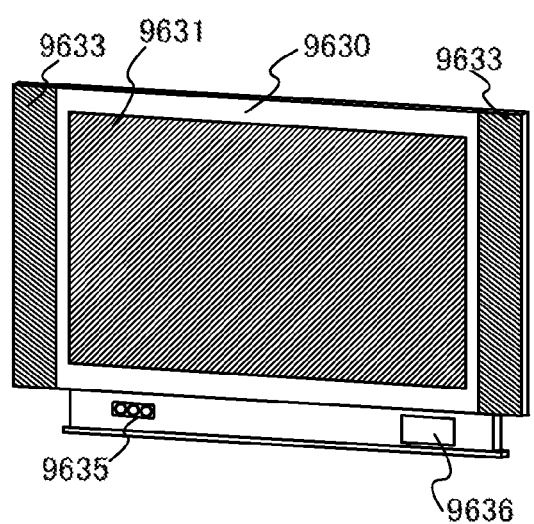

FIG. 23C illustrates a television set, which can include a housing 9630, a display portion 9631, speakers 9633, operation keys 9635, a connection terminal 9636, and the like. The television set illustrated in FIG. 23C has a function of processing an electric wave for television and converting the electric wave into a pixel signal, a function of processing the pixel signal and converting the pixel signal into a signal suitable for display, a function of converting a frame frequency of the pixel signal, and the like. Note that the television set illustrated in FIG. 23C can have a variety of functions without being limited to the above.

Figure 24A:
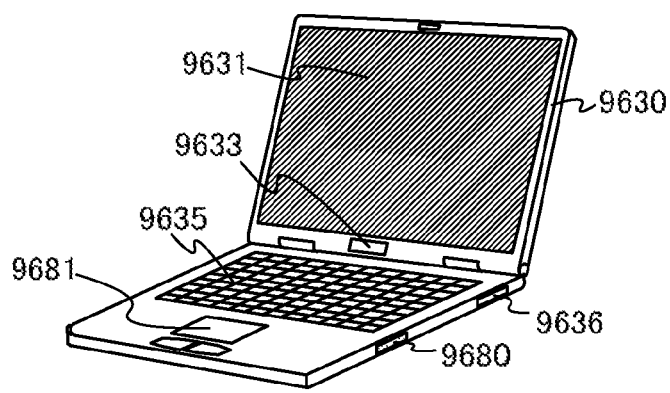
FIGS. 24A and 24B each illustrate an electronic apparatus.

FIG. 24A illustrates a computer, which can include a housing 9630, a display portion 9631, a speaker 9633, operation keys 9635, a connection terminal 9636, a pointing device 9681, and an external connection port 9680, and the like. The computer illustrated in FIG. 24A can have a function of displaying a variety of information (e.g., a still image, a moving image, and a text image) on the display portion; a function of controlling processing by a variety of software (programs); a communication function such as wireless communication or wire communication; a function of connecting to various computer networks by using the communication function; a function of transmitting or receiving a variety of data by using the communication function; and the like. Note that the computer illustrated in FIG. 24A can have various functions without limitation to the above.

Figure 24B:
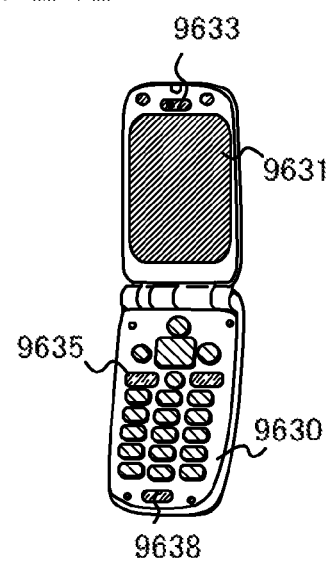

FIG. 24B illustrates a mobile phone, which can include a housing 9630, a display portion 9631, a speaker 9633, operation keys 9635, a microphone 9638, and the like. The mobile phone illustrated in FIG. 24B can have various functions such as a function of displaying various kinds of information (e.g., a still image, a moving image, and a text image); a function of displaying a calendar, a date, the time, and the like on the display portion; a function of operating or editing the information displaying on the display portion; and a function of controlling processing by various kinds of software (programs). Note that functions of the mobile phone illustrated in FIG. 24B can have various functions without limitation to the above.

TFTs in the display portions for displaying information of the electronic apparatuses described in this embodiment can be formed by any of the manufacturing methods described in the above embodiments. That is, as described in Embodiment 1, productivity can be improved and an electronic apparatus having a display portion with high electric characteristics can be provided at low cost.

This embodiment can be combined with any of the structures disclosed in the other embodiments, as appropriate.

This application is based on Japanese Patent Application serial no. 2008-330094 filed with Japan Patent Office on Dec. 25, 2008, the entire contents of which are hereby incorporated by reference.

What is claimed is:
1. A display device comprising:
a gate electrode formed over a substrate;
a gate insulating film formed over the gate electrode;
a wiring and an electrode layer provided over the gate insulating film; and
a high-resistance oxide semiconductor layer formed between the wiring and the electrode layer over the gate insulating film,
wherein the wiring comprises a first low-resistance oxide semiconductor layer and a first conductive layer over the first low-resistance oxide semiconductor layer,
wherein the electrode layer comprises a second low-resistance oxide semiconductor layer and a second conductive layer covering a first portion of the second low-resistance oxide semiconductor layer, and
wherein a second portion of the second low-resistance oxide semiconductor layer is arranged to function as a pixel electrode.

2. A display device comprising:
a gate electrode formed over a substrate;
a gate insulating film formed over the gate electrode;
a high-resistance oxide semiconductor layer formed in an island shape over the gate insulating film; and
a wiring and an electrode layer provided over the gate insulating film and the high-resistance oxide semiconductor layer,
wherein the wiring comprises a first low-resistance oxide semiconductor layer and a first conductive layer over the first low-resistance oxide semiconductor layer,
wherein the electrode layer comprises a second low-resistance oxide semiconductor layer and a second conductive layer covering a first portion of the second low-resistance oxide semiconductor layer, and
wherein a second portion of the second low-resistance oxide semiconductor layer is arranged to function as a pixel electrode.

3. A display device comprising:
a wiring and an electrode layer over a substrate;
a high-resistance oxide semiconductor layer formed between the wiring and the electrode layer over the substrate;
a gate insulating film formed over the high-resistance oxide semiconductor layer; and
a gate electrode formed over the gate insulating film,
wherein the wiring comprises a first low-resistance oxide semiconductor layer and a first conductive layer over the first low-resistance oxide semiconductor layer,
wherein the electrode layer comprises a second low-resistance oxide semiconductor layer and a second conductive layer covering a first portion of the second low-resistance oxide semiconductor layer, and
wherein a second portion of the second low-resistance oxide semiconductor layer is arranged to function as a pixel electrode.

4. A display device comprising:
a high-resistance oxide semiconductor layer formed in an island shape over a substrate;
a wiring and an electrode layer over the substrate and the high-resistance oxide semiconductor layer;
a gate insulating film formed over the high-resistance oxide semiconductor layer; and
a gate electrode formed over the gate insulating film,
wherein the wiring comprises a first low-resistance oxide semiconductor layer and a first conductive layer over the first low-resistance oxide semiconductor layer,
wherein the electrode layer comprises a second low-resistance oxide semiconductor layer and a second conductive layer covering a first portion of the second low-resistance oxide semiconductor layer, and
wherein a second portion of the second low-resistance oxide semiconductor layer is arranged to function as a pixel electrode.

5. A method of manufacturing a display device, comprising the steps of:
- forming a gate electrode over a substrate;
- forming a gate insulating film over the gate electrode;
- forming a wiring and an electrode layer over the gate insulating film by stacking a low-resistance oxide semiconductor layer and a conductive layer over the low-resistance oxide semiconductor layer; and
- forming a high-resistance oxide semiconductor layer between the wiring and the electrode layer over the gate insulating film,
- wherein a region of the conductive layer which corresponds to a region of the electrode layer functioning as a pixel electrode is etched, so that the low-resistance oxide semiconductor layer is exposed.

6. A method of manufacturing a display device, comprising the steps of:
- forming a gate electrode over a substrate;
- forming a gate insulating film over the gate electrode;
- forming a high-resistance oxide semiconductor layer so as to have an island shape over the gate insulating film; and
- forming a wiring and an electrode layer over the gate insulating film and the high-resistance oxide semiconductor layer by stacking a low-resistance oxide semiconductor layer and a conductive layer over the low-resistance oxide semiconductor layer,
- wherein a region of the conductive layer which corresponds to a region of the electrode layer functioning as a pixel electrode is etched, so that the low-resistance oxide semiconductor layer is exposed.

7. A method of manufacturing a display device, comprising the steps of:
- forming a wiring and an electrode layer over a substrate by stacking a low-resistance oxide semiconductor layer and a conductive layer over the low-resistance oxide semiconductor layer;
- forming a high-resistance oxide semiconductor layer between the wiring and the electrode layer over the substrate;
- forming a gate insulating film over the high-resistance oxide semiconductor layer; and
- forming a gate electrode over the gate insulating film,
- wherein a region of the conductive layer which corresponds to a region of the electrode layer functioning as a pixel electrode is etched, so that the low-resistance oxide semiconductor layer is exposed.

8. A method of manufacturing a display device, comprising the steps of:
- forming a high-resistance oxide semiconductor layer so as to have an island shape over a substrate;
- forming a wiring and an electrode layer over the substrate and the high-resistance oxide semiconductor layer by stacking a low-resistance oxide semiconductor layer and a conductive layer over the low-resistance oxide semiconductor layer;
- forming a gate insulating film over the high-resistance oxide semiconductor layer; and
- forming a gate electrode over the gate insulating film,
- wherein a region of the conductive layer which corresponds to a region of the electrode layer functioning as a pixel electrode is etched, so that the low-resistance oxide semiconductor layer is exposed.

9. The display device according to claim 1, wherein the display device is incorporated into an electronic apparatus.

10. The display device according to claim 2, wherein the display device is incorporated into an electronic apparatus.

11. The display device according to claim 3, wherein the display device is incorporated into an electronic apparatus.

12. The display device according to claim 4, wherein the display device is incorporated into an electronic apparatus.

* * * * *